US011444532B2

(12) United States Patent
Liu et al.

(10) Patent No.: US 11,444,532 B2
(45) Date of Patent: Sep. 13, 2022

(54) NON-LINEAR CLAMP STRENGTH TUNING METHOD AND APPARATUS

(71) Applicant: Intel Corporation, Santa Clara, CA (US)

(72) Inventors: Xiaosen Liu, Portland, OR (US); Krishnan Ravichandran, Saratoga, CA (US); Harish Krishnamurthy, Beaverton, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 256 days.

(21) Appl. No.: 16/727,759

(22) Filed: Dec. 26, 2019

(65) Prior Publication Data
US 2021/0203228 A1 Jul. 1, 2021

(51) Int. Cl.
*G05F 1/56* (2006.01)
*G05F 1/563* (2006.01)
*G05F 1/575* (2006.01)
*G05F 1/59* (2006.01)
*H02M 3/158* (2006.01)
(Continued)

(52) U.S. Cl.
CPC .......... *H02M 3/158* (2013.01); *H02M 1/088* (2013.01); *H02N 13/00* (2013.01); *H03L 5/00* (2013.01)

(58) Field of Classification Search
CPC .... G05F 1/56; G05F 1/563; G05F 1/571–573; G05F 1/575; G05F 1/59; H02M 3/158
See application file for complete search history.

(56) References Cited

U.S. PATENT DOCUMENTS

| 10,203,709 B1* | 2/2019 | Feng | G05F 1/461 |
| 10,845,831 B2* | 11/2020 | Liu | G05F 1/595 |

(Continued)

FOREIGN PATENT DOCUMENTS

| CN | 207191045 U | * | 4/2018 |
| CN | 110045774 A | * | 7/2019 |

(Continued)

OTHER PUBLICATIONS

Young-Jae Min1 "A 1.3V input fast-transient—response time digital low-dropout regulator with a VSSa generator for DVFS system, Publicized Jun. 23, 2017", Jun. 23, 2017 (Year: 2017).*

(Continued)

*Primary Examiner* — Sisay G Tiku
(74) *Attorney, Agent, or Firm* — Schwabe, Williamson & Wyatt, P.C.

(57) ABSTRACT

A 3-level ripple quantization scheme provides power transistor (MOS) strength-tuning mechanism focused on the transient clamp period. The 3-level ripple quantization scheme solves the digital low dropout's (D-LDO's) tradeoff between silicon area (e.g., decoupling capacitor size), quiescent power consumption (e.g., speed of comparators), wide load range, and optimal output ripple. The 3-level ripple quantization scheme eliminates oscillation risk from either wide dynamic range or parasitic by exploiting asynchronous pulse patterns. As such, ripple magnitude for both fast di/dt loading events and various steady-state scenarios are shrunk effectively, resulting significant efficiency benefits.

22 Claims, 19 Drawing Sheets

(51) Int. Cl.
*H02M 1/088* (2006.01)
*H02N 13/00* (2006.01)
*H03L 5/00* (2006.01)

(56) References Cited

U.S. PATENT DOCUMENTS

| | | | | |
|---|---|---|---|---|
| 11,177,738 | B1* | 11/2021 | Pahkala | G04F 10/005 |
| 2014/0084881 | A1* | 3/2014 | Shih | G05F 1/565 |
| | | | | 323/269 |
| 2014/0277812 | A1* | 9/2014 | Shih | G05F 1/563 |
| | | | | 700/298 |
| 2019/0013784 | A1* | 1/2019 | Li | H03F 3/26 |
| 2019/0243440 | A1* | 8/2019 | Meinerzhagen | G06F 1/324 |
| 2020/0007117 | A1* | 1/2020 | Tang | H03K 7/06 |
| 2020/0393861 | A1* | 12/2020 | Shih | G05F 1/563 |
| 2021/0103308 | A1* | 4/2021 | Liu | G05F 1/563 |
| 2021/0351697 | A1* | 11/2021 | Tyagi | G01R 19/16538 |

FOREIGN PATENT DOCUMENTS

| | | | | |
|---|---|---|---|---|
| CN | 111208858 | A * | 5/2020 | |
| CN | 113054830 | A * | 6/2021 | ............... H03L 5/00 |
| EP | 3832428 | A1 * | 6/2021 | ............. G05F 1/461 |
| KR | 101849901 | B1 * | 4/2018 | |

OTHER PUBLICATIONS

Raghavan Kumar, "A SCA-Resistant AES Engine in 14nm CMOS with Time/Frequency-Domain Leakage Suppression using Non-linear Digital LDO Cascaded with Arithmetic Countermeasures", Jun. 19, 2020 (Year: 2020).*

Salem, Loai G. et al., "A 100nA-to-2mA Successive-Approximation Digital LDO with PD Compensation and Sub-LSB Duty Control Achieving a 15.1ns Response Time at 0.5V", ISSCC 2017, Session 20, Digital Voltage Regulators and Low-Power Techniques, 20.3, 3 pgs.

* cited by examiner

NON-LINEAR CLAMP STRENGTH TUNING METHOD AND APPARATUS

BACKGROUND

Modern system-on-chips (SOCs) are embracing Digital Low-drop Out (D-LDO) regulators for their minimum dropout, unconditional stability and ease of implementing non-linear algorithms for improved transient response. Traditional D-LDOs adopt a mechanism of turning all the transistors to charge the output capacitor as quickly as possible to minimize the droop for such large transient events. The mechanism of turning all the transistors is also used to counter the dynamic range of modern day digital loads of, for example, greater than 100,000× from the lightest load to the $I_{CCmax}$ (maximum current from input supply) within a few clock cycles.

Asynchronous hysteretic control architectures in digital low-dropout (D-LDO) regulators provide fast response for dynamic load changes while consuming very low power during slow or static load currents. When the output voltage (on an output power supply rail coupled to the D-LDO) hits the lower threshold, the D-LDO turns ON all the devices. When the D-LDO hits the higher threshold, the D-LDO turns OFF all the devices to try and keep the output voltage within the hysteretic window. Here, the hysteretic window is a voltage window between a high voltage threshold $V_H$ and a low voltage threshold $V_L$. Thus, the hysteretic non-linear action can be combined with a simple integral controller to keep the output voltage (Vout) within limits and to help regulate the output with a very high bandwidth.

However, variations in the resistance of the power devices over PVT (process, voltage, and temperature) could be as large as 3-5×. Further, with different dropout voltages for a given device resistance, the strength of the fully ON D-LDO device could also drastically increase. With finite delays in comparators, the drastically higher strength of the fully ON D-LDO could result in large overshoots and undershoots on Vout and sustained oscillations on Vout with large peak-to-peak ripple. These anomalies are further exasperated with PDN (pull-down) parasitic inductances which could therefore result in an oscillating D-LDO.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
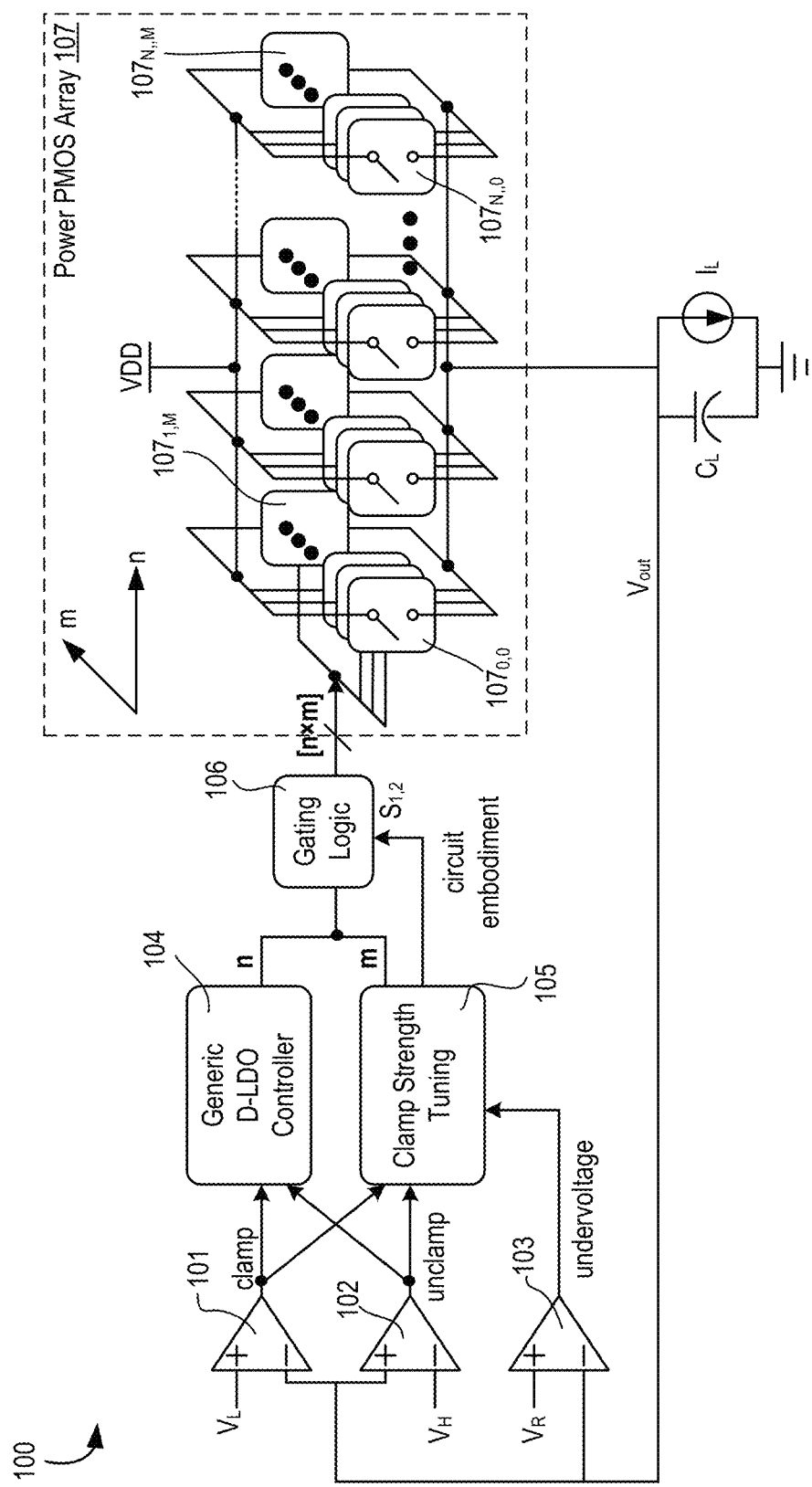
FIG. 1 illustrates an architecture of asynchronous D-LDO with non-linear clamp strength-turning scheme with 3-level ripple quantization, in accordance with some embodiments.

Various embodiments describe a new 3-level ripple quantization scheme with a power transistor (MOS) strength-tuning mechanism focused on the transient clamp period. The 3-level ripple quantization scheme solves the D-LDO's tradeoff between silicon area (e.g., decoupling capacitor size), quiescent power consumption (e.g., speed of comparators), wide load range, and optimal output ripple. The 3-level ripple quantization scheme eliminates oscillation risk from either wide dynamic range or parasitic by exploiting asynchronous pulse patterns. As such, ripple magnitude for both fast di/dt loading events and various steady-state scenarios are shrunk effectively, resulting significant efficiency benefits.

Conventional D-LDOs typically use coarse and fine power strength tuning to achieve wide load dynamic range, and utilize a nonlinear hysteretic window to control the worst droops under fast di/dt events. However, this conventional method has simple clamp and unclamp mechanism and has significant ripple magnitude problem. For example, for up to 2 mA load current, an output ripple may be greater than 40 mV. To alleviate the steady-state ripple that is detrimental to efficiency, the conventional D-LDOs use ultra-fast switching frequency which results in significant dynamic losses. In other words, with specific power budget and ripple requirement, the conventional D-LDOs have a limited load dynamic range.

The scheme of various embodiments dynamically tunes the clamp strength of D-LDO based on ripple-quantization nature of a nonlinear control. In some embodiments, event-driven mechanism indirectly senses load current, which could have both wide dynamic range and fast di/dt changing speed. The scheme of various embodiments also detects both wide dynamic range-induced and package parasitic-induced oscillation risks, and stabilizes the D-LDO's operation.

In some embodiments, the D-LDO comprise a first comparator to compare an output voltage Vout or a divided version of the output voltage on an output power supply rail with a first reference (e.g., $V_L$), wherein the first comparator is to generate a first output (e.g., clamp). In some embodiments, the D-LDO comprises a second comparator to compare the output voltage or a divided version of the output voltage on the output power supply rail with a second reference (e.g., $V_H$), wherein the second comparator is to generate a second output (e.g., unclamp). In some embodiments, the D-LDO comprises a third comparator to compare the output voltage or a divided version of the output voltage on the output power supply rail with a third reference (e.g., $V_R$), wherein the third comparator is to generate a third output (e.g., under voltage). In various embodiments, the D-LDO comprises power gates coupled to the output power supply rail and an input power supply rail (e.g., VDD or Vin). In some embodiments, the D-LDO comprises two controllers—first controller and a second controller. The first controller receives the first and second outputs and generates a code 'n' indicative of a coarse setting for power gates. The first controller provides linear strength tuning of the power gates, in accordance with various embodiments. The second controller receives the first, second, and third outputs, wherein the second controller is generates a fine code 'm' for the power gates. The second controller provides non-linear strength tuning of the power gates, in accordance with various embodiments.

The D-LDO further comprises a gating logic that receives the coarse and fine codes, and generates a two dimensional code to enable power gates, wherein the power gates are arranged in an array configuration (e.g., n×m). The array configuration can be a thermometer array or a binary weighted array. Here, the first reference $V_L$ has a voltage level below a voltage level of the second reference $V_H$, and the third reference $V_R$ has a voltage level below the voltage level of the first reference Yu Vout is expected to be between $V_L$ and $V_H$.

In various embodiments, when the first comparator asserts the first output, it indicates that the output voltage is below the first reference. In this case, the first controller can turn on power gate (e.g., all power gates). When the second comparator asserts the second output, it indicates that the output voltage is above the second threshold. In this case, the first controller turns off power gates (e.g., all power gates). When the third comparator asserts the third output, it indicates that the output voltage is below the third reference. In various embodiments, the second controller comprises a pattern detector, which generates a pulse when the first and second outputs appear in a staggered order indicative of an oscillation of the output voltage. In some embodiments, the second controller comprises a filter coupled to an output of the pattern detector to filter the pulse from noise. In some embodiments, the second controller comprises a shift register coupled to the output of the filter, wherein the shift register generates the fine code dynamically.

There are many technical effects of various embodiments. For example, the scheme of various embodiments significantly extends the dynamic range of any given D-LDO. Different from using conventional current sensor based schemes, the scheme of some embodiments tunes the D-LDO's clamp strength without the need for any current sensor or additional analog circuits. As such, the scheme results in no additional quiescent current and maintains the low power feature. Moreover, the scheme eliminates the wide-range-induced and parasitic-induced instabilities and achieves reliable and minimum noise performances, which is vital for robust products. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates architecture 100 of asynchronous D-LDO with non-linear clamp strength-turning scheme, in accordance with some embodiments. In some embodiments, architecture 100 is a standalone intellectual property (IP) block that can be instantiated for use in different parts of an SOC.

Architecture 100 comprises three comparators—101, 102, and 103, hence 3-levels of quantization. Any suitable design for comparators 101, 102, and 103 can be used. For example, comparators 101, 102, and 103 can have auto-zero correction, offset cancellation, fast resolution, etc. Comparator 101 compares the output voltage Vout, on output power supply rail Vout, against a low threshold voltage $V_L$. The output supply rail Vout is coupled to a load modeled as a load capacitor $C_L$ and current sink $I_L$. Here, the load can be any suitable load such as memory, cache, processor core, processor uncore, input-output circuits, SOC, etc.

Here, node names and signal names are interchangeably used. For example, Vout may refer to supply node Vout or signal Vout depending on the context of the sentence. In some embodiments, comparators 101, 102, and 103 use a version of Vout instead of Vout. For example, a resistive or voltage divider divides down Vout, and comparators 101, 102, and 103 receive the divided down version of Vout.

Comparator 102 compares the output voltage Vout, on output power supply rail Vout, against a high threshold voltage $V_H$. Comparator 103 compares the output voltage Vout, on output power supply rail Vout, against a reset threshold voltage $V_R$. Any suitable circuit can be used to generate threshold voltages $V_L$, $V_H$, and $V_R$. For example, a resistor divider network can generate voltages $V_L$, $V_H$, and $V_R$. In some embodiments, voltages $V_L$, $V_H$, and $V_R$ are programmable by software (e.g., operating system), hardware (e.g., registers or fuses), or a combination of them.

Architecture 100 further comprises a first controller 104 (e.g., generic D-LDO controller), and a second controller 105 (e.g., clamp strength turning controller) that receive outputs of comparators 101, 102, and 103. Here, generic D-LDO controller 104 is a typical controller in a D-LDO that decides a number of active power gates 107 in accordance with the logic levels of outputs clamp and unclamp from comparators 101 and 102, respectively. Clamp strength tuning block 105 receives outputs (clamp, unclamp, and under voltage) from comparators 101, 102, and 103, and generates a dynamic or adaptive code 'm' for gating logic 106. The output [n×m] of gating logic 106 controls the power array 107.

In some embodiments, power switches 107 (e.g., switches $107_{n,m}$), are implemented as p-type devices (e.g., PMOS), and are arranged in a two-dimensional array as [n×m]. For simplicity, 'n' represents the number of units and ranges from 0 to N, which is coarse granularity of the D-LDO, and 'm' represents the strength per each unit and ranges from 0 to M, which is the fine granularity of the D-LDO. The conventional nonlinear control by first controller 104 will turn on and off the n units based on the hysteretic comparison with $V_{out}$.

Here, the hysteretic window is defined by thresholds $V_L$ and $V_H$. The "ON" and "OFF" action for the p-type switch 107 are called clamp and unclamp, respectively. As conventional D-LDO architecture without nonlinear strength tuning, based on the clamp/unclamp pulse train, the 'n' and 'm' granularities are modulated for proper load current $I_{load}$ or $I_L$ quantization in steady-state as:

$$\text{Baseline: } I_{load} = \begin{cases} N \times M \times I_{LSB,DLDO} & \text{clamp: } V_{out} < V_L \\ n \times m_s \times I_{LSB,DLDO} & \text{steady-state: } V_L < V_{out} < V_H \\ 0 & \text{unclamp: } V_{out} > V_H \end{cases} \quad \text{Equation 1}$$

where $I_{LSB,D-LDO}$ is the least significant bit (LSB) current strength of D-LDO 100t.

Conventional D-LDOs use coarse-fine tuning of 'n' and 'm' in steady state; however, during the clamp/unclamp periods, conventional D-LDO strengths are simply maximized as N and M, or minimized as 0. One such conventional D-LDO operation is illustrated in FIG. 2.

Figure 2:
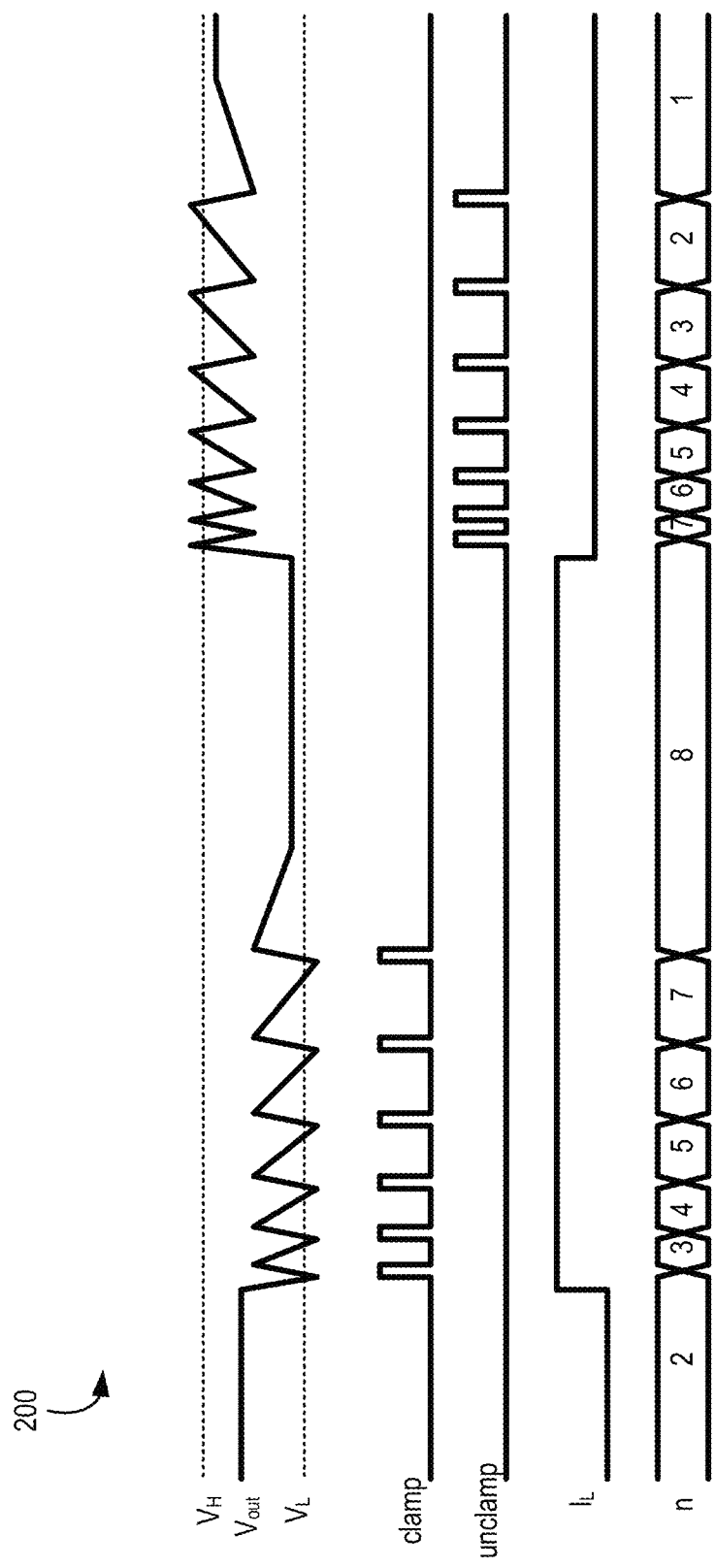
FIG. 2 illustrates a timing diagram showing D-LDO regulation with 2-level ripple quantization.

FIG. 2 illustrates timing diagram 200 showing D-LDO regulation with 2-level ripple quantization. Timing diagram 200 shows that when Vout falls below threshold $V_L$, clamp pulses are generated and D-LDO controller 104 increments the code 'n' (e.g., from 2 to 3, 4, 5, 6, and 7). Thereafter, Vout achieves steady state and D-LDO controller 104 freezes the code 'n' (e.g., n=8). Continuing with this example, Vout (due to load changes) may rise above threshold $V_H$. In that case, unclamp pulses are generated and D-LDO controller 104 decrements the code 'n' (e.g., from 8 to 7, 6, 5, 4, 3, 2, and 1).

Such a simple tuning algorithm is not suitable for modern SoC power supply requirements, which need a wide load variation range for fast computing, an as small as possible output decoupling capacitor $C_L$, and as small output ripple as possible for high efficiency computing. The risk happens when the D-LDO operates at the light load end of the wide $I_L$ range, for example, current loads in a range of 0.5 mA to 5 mA.

Figure 3:
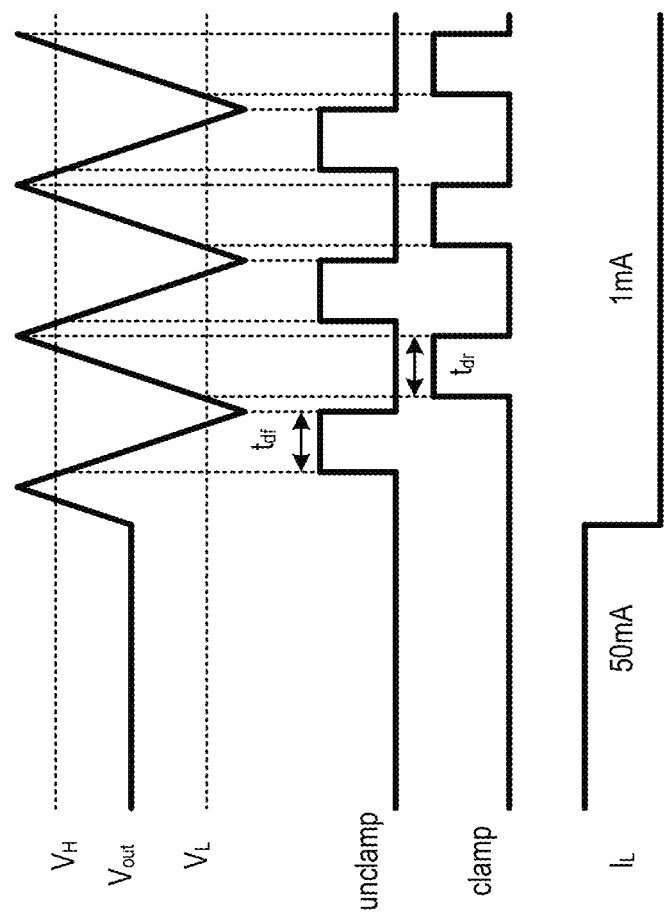
FIG. 3 illustrates a timing diagram showing loop-delay-induced limited cycling oscillation between clamp and unclamp pulses for wide $I_L$ (load current) variation range, and small Vout regulation range applications under light-load scenarios.

FIG. 3 illustrates timing diagram 300 showing loop-delay-induced limited cycling oscillation between clamp and unclamp pulses for wide $I_L$ variation range (e.g., between 50 mA and 1 mA), small Vout regulation range applications under light-load scenarios. The detection delay time of the regulation loop for $V_H$ and $V_L$ thresholds, $t_{df}$ and $t_{dr}$ respectively, may be larger than the trip time across the hysteretic $V_H$-$V_L$ window. In this case, conventional D-LDO controller 104 alone does not have enough time to evaluate proper steady-state power strength, and causes Vout to start bouncing between the $V_H$-$V_L$ window with large ripple amplitude. The mathematic expression of the stability conditions is expressed as:

Condition 1

$$t_{df} < \frac{C_L \times (V_H - V_L)}{I_L} \quad \text{Equation 2}$$

Condition 2

$$t_{dr} < \frac{C_L \times (V_H - V_L)}{I_{LDO,clamp} - I_L} \quad \text{Equation 3}$$

Note, that Condition 2 is easily violated in modern high-speed high power D-LDO operating in light load (e.g., range of 0.5 mA to 5 mA). For example, if $C_L$=100 pF, $V_H$-$V_L$=75 mV, $I_{LDO,clamp}$=$I_{LDO,max}$=500 mA, $I_L$=1 mA, the maximum allowed regulation delay for $V_L$ threshold need to be less than 15 ps (picoseconds), which is not feasible for most deep-submicron CMOS technology. As a reference, a typical regulation delay for 14 nm CMOS process technology node is about 600 ps (picoseconds), which implies a 3V oscillation ripple voltage between $V_H$ and $V_L$ and becomes a significant bottleneck for the development of D-LDO technology.

Figure 4:
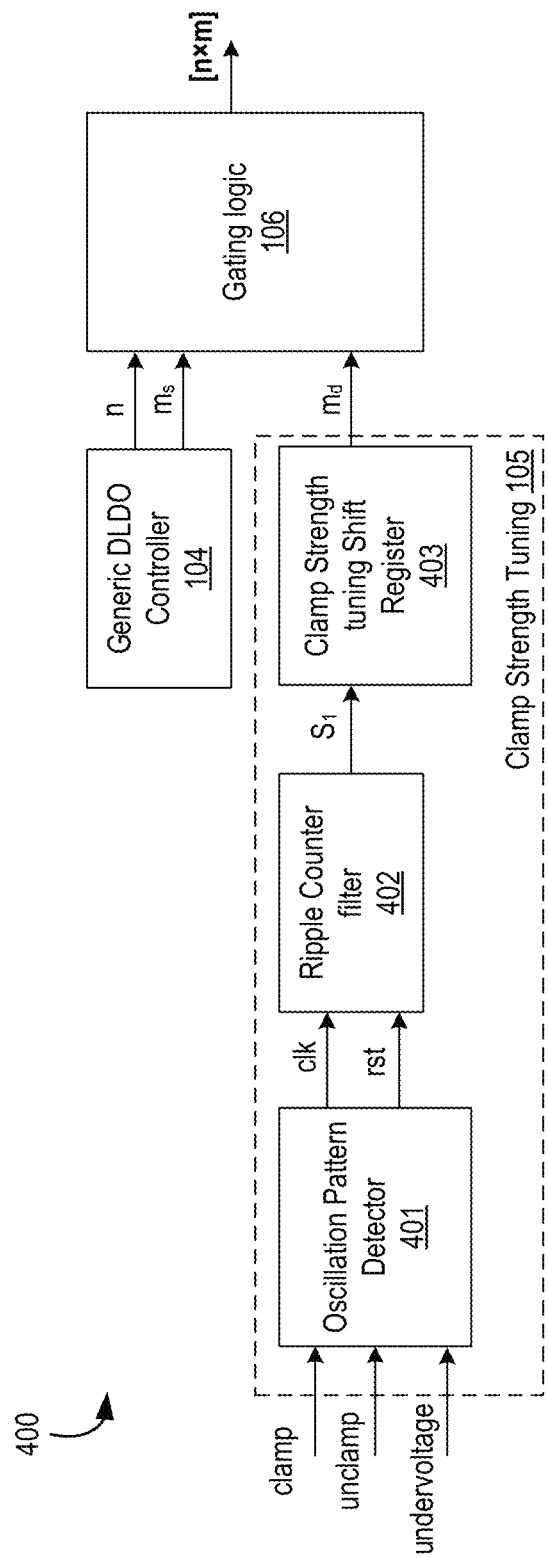
FIG. 4 illustrates an apparatus of non-linear clamp strength tuning scheme instantiated with the 3-level ripple quantization, in accordance with some embodiments.

FIG. 4 illustrates apparatus 400 of non-linear clamp strength tuning scheme instantiated with 3-level ripple quantization, in accordance with some embodiments. In various embodiments, clamp strength tuning block 105 comprises oscillation pattern detector 401, ripple counter filter 402, and clamp strength tuning shift register 403. Gating logic 106 receives output $m_d$ of clamp strength tuning shift register 403, and outputs n and $m_s$ from generating D-LDO controller 104. In various embodiments, wide-dynamic range of D-LDO oscillation is eliminated by following equation 4 as implemented by generating D-LDO controller 104, clamp strength tuning block 105, and gating logic 106.

Per equation 4, the load current quantization scheme can be expressed as:

$$I_{LDO} = \begin{cases} N \times m_d \times I_{LSB,DLDO} & \text{clamp: } V_{out} < V_L \\ n \times m_s \times I_{LSB,DLDO} & \text{steady-state: } V_L < V_{out} < V_H \\ 0 & \text{unclamp: } V_{out} > V_H \end{cases} \quad \text{Equation 4}$$

where $m_d$ is the dynamic strength during clamp period, and $m_s$ is the steady-state strength during static period. Compared with the conventional D-LDO's simple strength tuning, here the D-LDO strength is separated into complex event-dependent variables as $m_d$ and $m_s$. These variables are finely programed with a nonlinear scheme. As a result, the D-LDO's tradeoff between wide dynamic range, quiescent power consumption, speed of response, and fine regulation resolution (smaller output ripple) is tackled.

With the development of faster switching D-LDO, the dynamic loss of power train (e.g., power by switches 107) becomes the dominant efficiency factor. Besides discriminating the strengths between clamp and steady-state periods, $I_{LDO,clamp}$ could be further developed as the following polynomial.

$$I_{LDO} = \begin{cases} [n \times \max(m_s, m_d) + (N - n) \times \\ \quad m_d] \times I_{LSB,DLDO} & \text{clamp: } V_{out} < V_L \\ n \times m_s \times I_{LSB,DLDO} & \text{steady-state: } V_L < V_{out} < V_H \\ 0 & \text{unclamp: } V_{out} > V_H \end{cases} \quad \text{Equation 5}$$

Compared with the conventional fixed and maximized N tiles of power gates 107 switching, n of N power gates 107 are already calculated by the regulator controller and do not need switching. Merely, the remaining power gates 107 are needed to be programmed as $m_d$, and minimum switching loss is achieved, in accordance with some embodiments.

Besides the conventional n and $m_s$ programed in generic controller 104, the nonlinear tuning shifts the D-LDO's dynamic strength under the clamp period, $m_d$, to the right by the triggering signal $S_1$. It implies that the D-LDO is operating in overkill strength scenarios and should decrease $m_d$ to minimize output ripple. $S_1$ is generated by oscillation pattern detector 401 and ripple counter filter 402. Oscillation pattern detector 401 defines when clamp and unclamp asynchronous pulses appear in staggered order as shown in FIG. 3. In that case, the D-LDO is in real oscillation status and generates $S_1$ to shift $m_d$. One embodiment of oscillation pattern detector 401 is illustrated in FIG. 5.

Figure 5:
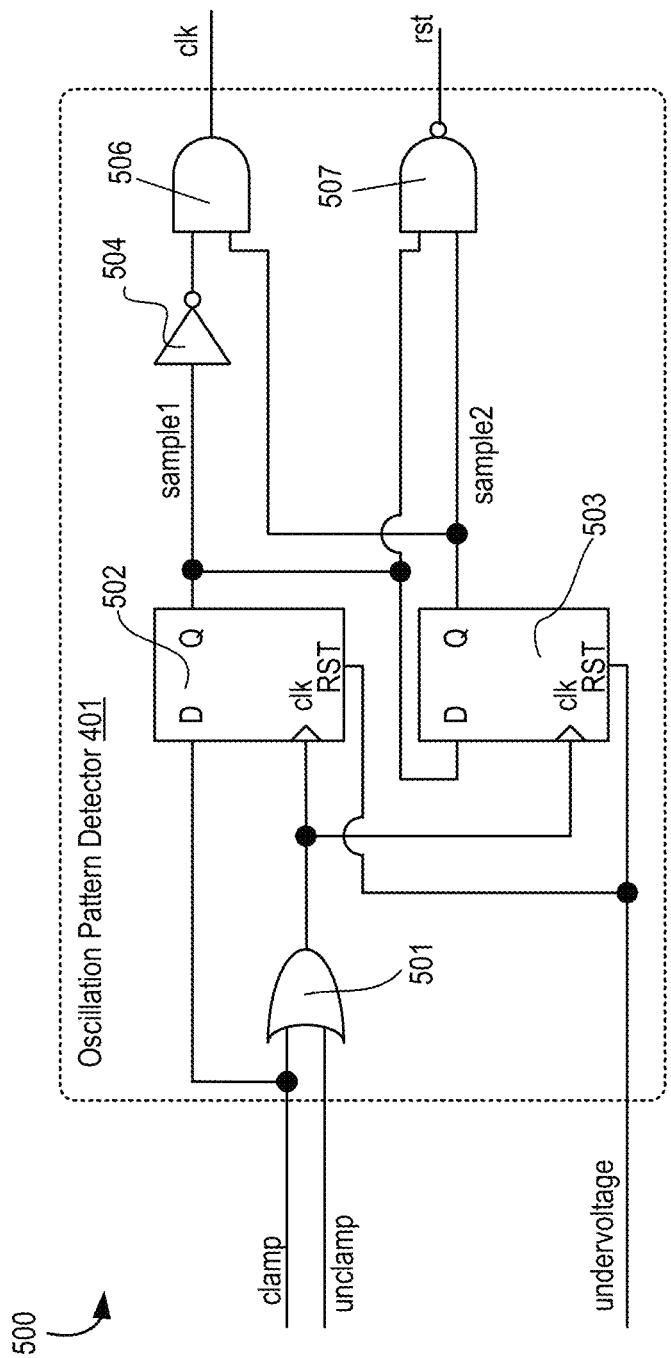
FIG. 5 illustrates a schematic of an oscillation pattern detector of FIG. 4, in accordance with some embodiments.

FIG. 5 illustrates schematic 500 of an oscillation pattern detector 401 of FIG. 4, in accordance with some embodiments. Here, oscillation pattern detector 401 comprises OR logic gate 501, two sequential units (e.g., flip-flops (FFs)) 502 and 503, inverter 504, AND gate 506, and NAND gate 507 coupled as shown. The clamp and unclamp signals are first recorded in 2-bit registers 502 and 503 as a shift detection window $S_1$. The 2-bit registers 502 and 503 capture a consecutive and staggered pattern as sample1 and sample2, a $S_1$ pulse is sent out (not shown here). More registers can be used to determine more than consecutive and staggered pattern.

Sample1 and sample 2 are reset to 0 (or can be set to 1 with inverted logic) when under voltage is detected. If a consecutive pattern of clamp or unclamp is not registered by FFs 502 and 503, then reset "rst" is trigged by NAND gate 507. This "rst" signal resets subsequent logic to reset the $S_1$ pulse. The output of AND gate 506 generates a clock signal "clk" which indicates a consecutive and staggered pattern, and thus the shift detection window $S_1$.

Referring back to FIG. 4, in various embodiments, ripple counter filter 402 couples to oscillation pattern detector 401, and enlarges the pattern detection window $S_1$ from oscillation pattern detector 401 to eliminate erroneously triggering by oscillation pattern detector 401. The output clock "clk" from oscillation pattern detector 401 causes the ripple counter filter 402 to count and enlarge pattern detection window according to a size of filter 402. The reset signal "rst" resets the count of filter 402 if oscillation pattern detector 401 captures an erroneous trigger. The output of filter 402 is pulse $S_1$. One embodiment of ripple counter filter 402 is illustrated by FIG. 6.

Figure 6:
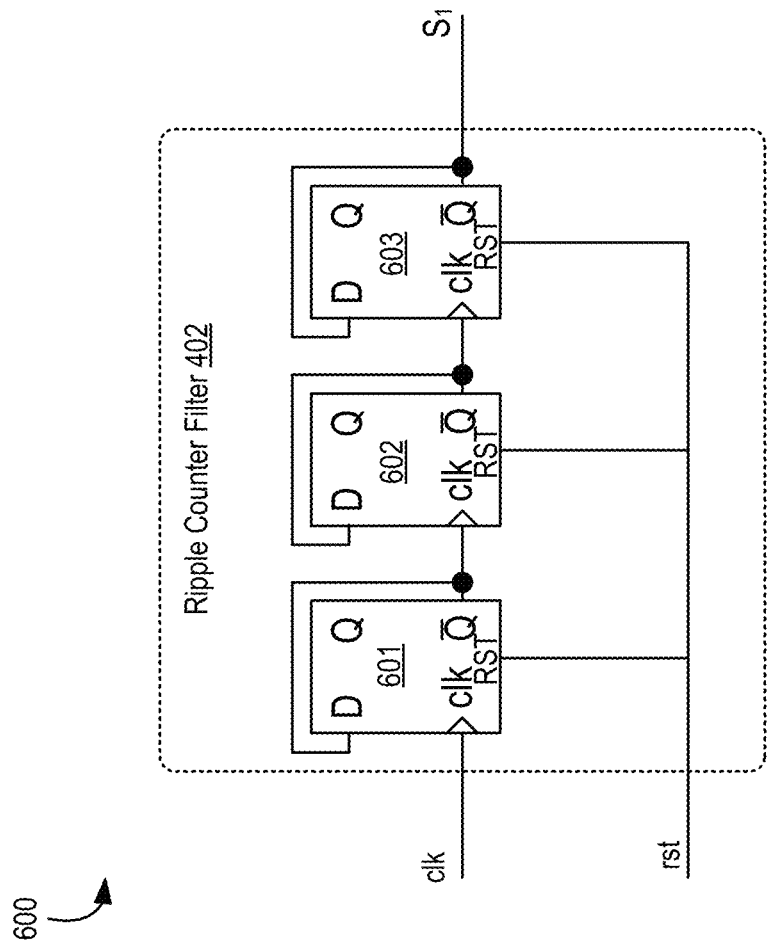
FIG. 6 illustrates a schematic of a ripple counter filter of FIG. 4, in accordance with some embodiments.

FIG. 6 illustrates schematic 600 of ripple counter filter 402 of FIG. 4, in accordance with some embodiments. Ripple counter filter 402 is added to enlarge the pattern detection window to eliminate erroneously triggering. There are many load profiles having the same sample1 and sample2 pattern but should not be taken as overkill strength alerts. Ripple counter filter 402 ensures that such erroneous alerts are avoided. Any suitable counter can be used for filter 402, and various embodiments are not limited to a 3-bit ripple counter. Ripple counter filter 402 comprises FFs 601, 602, and 603 coupled in a ripple counter configuration where an inverted output of each FF is fed back to the input D of the FF, and also provided as clock to the next FF. FF 601 receives clk and rst from oscillation pattern detector 401, and enlarges the pattern detection window $S_1$. Here taking three registers as an example, when $2^{(3-1)}=4$ consecutive clamp and/or unclamp pairs are detected by oscillation pattern detector 401, the clamp strength is determined to be reduced. The eventual $S_1$ propagates to shift register 403.

Referring back to FIG. 4, in various embodiments, $S_1$ propagates to clamp strength tuning shift register 403. Clamp strength tuning shift register 403 generates a dynamic code ma. Note, $m_s$ is a static code. This code ma is reset to zero if under voltage is detected. One embodiment of clamp strength running shift register is illustrated in FIG. 7.

Figure 7:
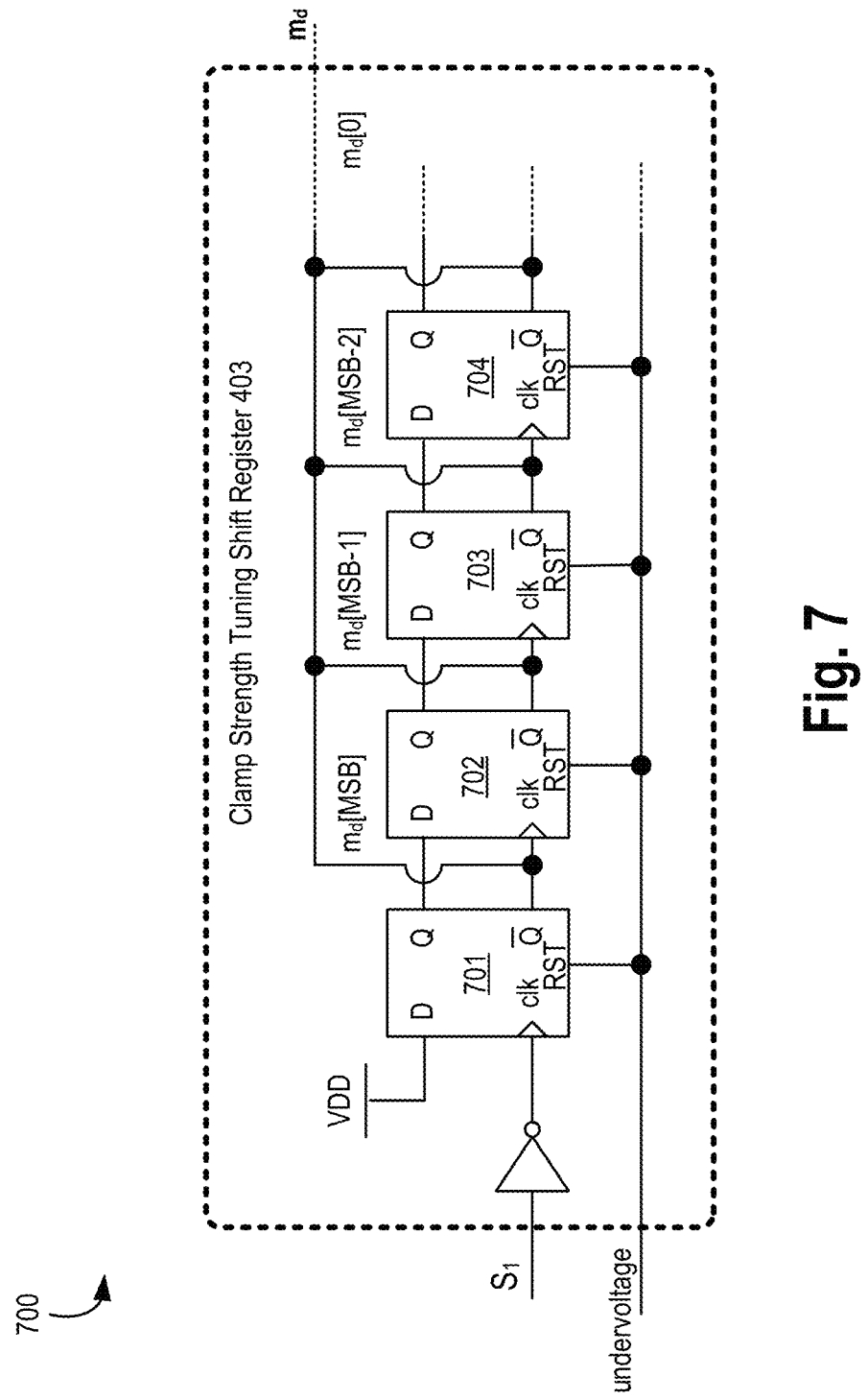
FIG. 7 illustrates a schematic of a clamp strength tuning shift register of FIG. 4, in accordance with some embodiments.

FIG. 7 illustrates schematic 700 of a clamp strength tuning shift register 403 of FIG. 4, in accordance with some embodiments. Shift register 403 comprises FFs 701, 702, 703, 704, and onwards coupled in series. Each FF is resettable by under voltage. The input $S_1$ is used as clock (e.g., inverted by inverter and then fed as clock to first FF 701). Output of each FF is fed as data into the next FF, while the inverted output of each FF is fed as clock to subsequent FF in the chain. The inverted output of FF 701 is $m_d$[MSB], where MSB is the most significant bit. The inverted output of the second FF 702 is $m_d$[MSB−1]. The inverted output of the third FF 703 is $m_d$[MSB−2], and so on till the inverted output of the last FF (not shown) is $m_d$[0]. The bus ma is then provided to gating logic 106.

Referring back to FIG. 4, in various embodiments, gating logic 106 receives traditional controls values n and $m_s$ from controller 104 along with code ma from shift register 403 to generate the [n×m] control code to enable/disable power gates 107. One example of gating logic is shown by FIG. 8.

Figure 8:
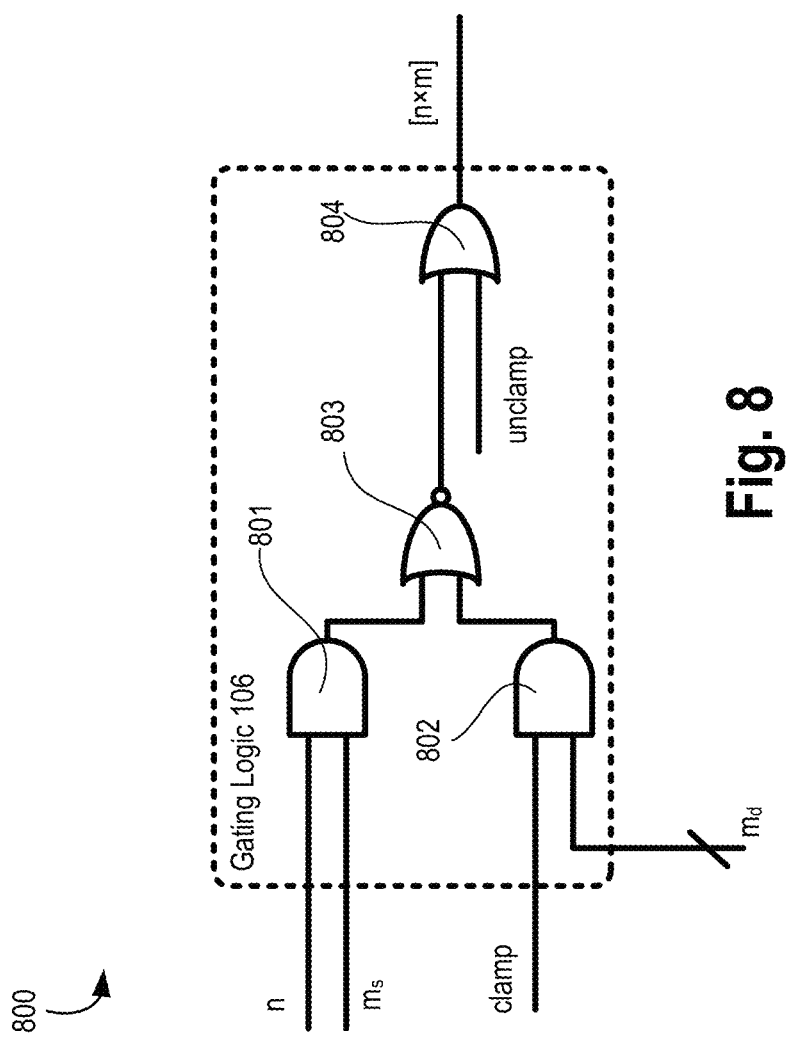
FIG. 8 illustrates a schematic of a gating logic of FIG. 4, in accordance with some embodiments.

FIG. 8 illustrates schematic 800 of gating logic 106 of FIG. 4, in accordance with some embodiments. Gating logic 106 comprises AND gates 801 and 802, NOR gate 803, and OR gate 804 coupled as shown. The gating logic shown in FIG. 8 instantiates the driving strength calculated in Equation 4 with various conditions. If the unclamp signal shows up (or is asserted), the gating logic outputs a logic high ('1') and shuts down all power gates such as PMOS power gates. If the clamp signal shows up (or is asserted), the gating logic outputs a strength value based on the result of $m_d$, and then turns on corresponding power gates. If neither clamp nor unclamp signals are not valid, the gating logic will send steady-state strength as $m_s$ for each power gate unit, and the total number of units is determined by 'n' from the D-LDO controller 104.

Note, that the practical strength mapping could be in various forms: if the power gates 107 are arranged in thermometer array, the tuning procedure is linearly as, $$I_{LDO,clamp} \propto n \times m_d \times I_{LSB,DLDO} (m_d = MSB \to MSB-1 \ldots 2 \to 1 \to 0)$$ Equation 6

If the power gates 107 are arranged in binary weighted array, the tuning procedure is nonlinearly as, $$I_{LDO,clamp} \propto n \times 2^{m_d} \times I_{LSB,DLDO} (m_d = MSB \to MSB-1 \ldots 2 \to 1 \to 0)$$ Equation 7

If the power gates 107 are arranged in binary-thermometer hybrid weighted, its strength is nonlinearly scaled down as, $$I_{LDO,clamp} \propto n \times 2^{\lfloor \frac{m_d}{2} \rfloor} \times I_{LSB,DLDO}$$ Equation 8

$$(m_d = MSB \to MSB-1 \ldots 2 \to 1 \to 0)$$

Figure 9:
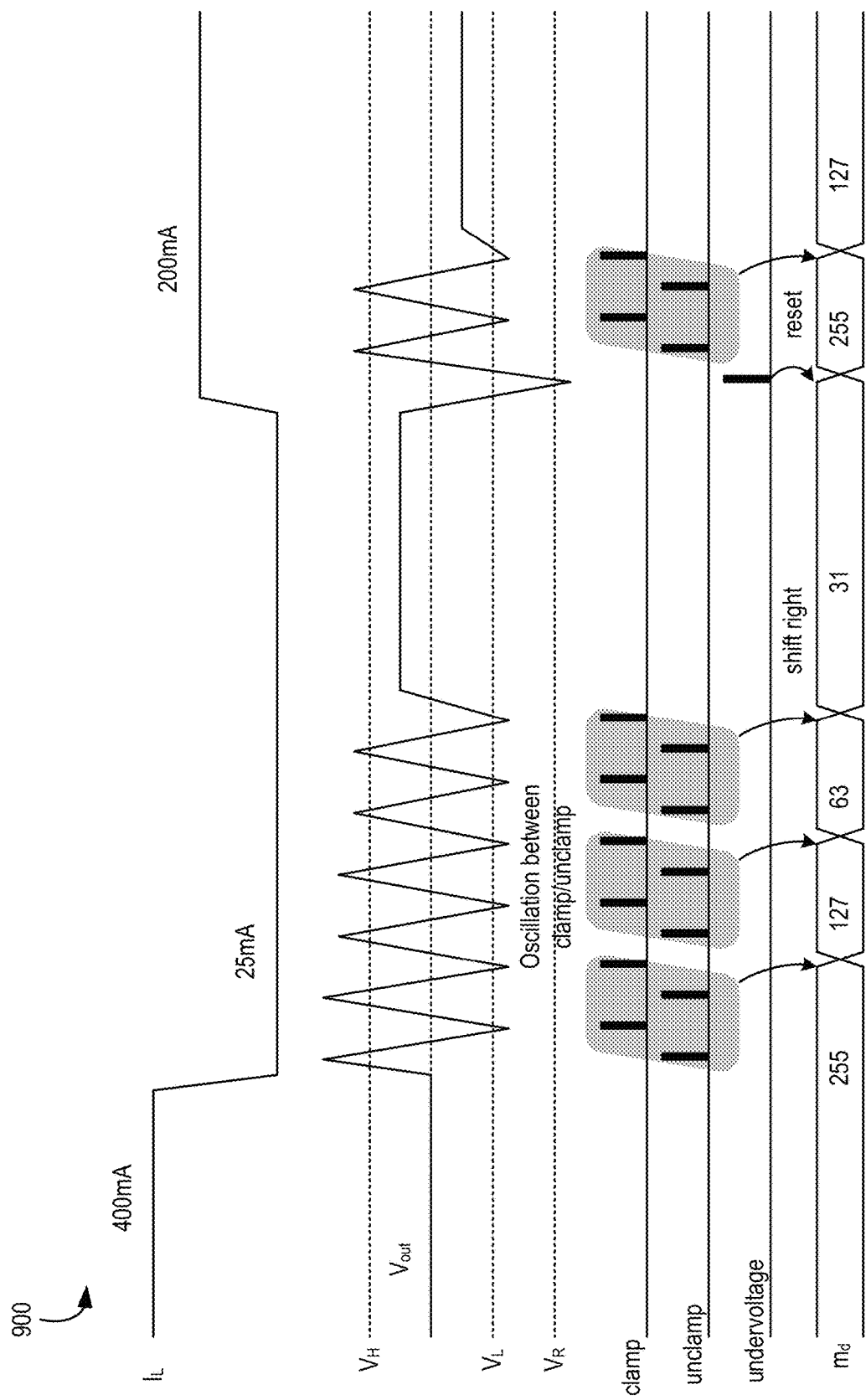
FIG. 9 illustrates a timing diagram of nonlinear clamp tuning to achieve wide dynamic load range and to minimize the output ripple noise, in accordance with some embodiments.

FIG. 9 illustrates timing diagram 900 of nonlinear clamp tuning to achieve wide dynamic load range and to minimize the output ripple noise, in accordance with some embodiments. Due to the tuning of D-LDO strength is unilateral from maximum to minimum, the scheme of various embodiments brings back the dynamic strength of the clamp period for heavy load conditions. As such, a third level threshold $V_R$ in FIG. 1 is introduced, which is lower than $V_L$, and detects the worst droop voltage (i.e., under voltage). All the three results, clamp, unclamp, and under voltage, are fed to dynamic strength tuning block 105.

Clamp and unclamp signals are used to detect the overstrong strength induced oscillation, and consequently reduce the strength m. Under voltage signal is used to detect a serious undershoot which would imply a much larger load current and thereby resetting the clamp strength, maximizing "m" as "M" for robust regulation. Therefore, based on this $V_{out}$ quantization scheme, the load current quantization could be sensed as:

$$I_{LDO} = \begin{cases} N \times M \times I_{LSB,DLDO} & \text{undervoltage: } V_{out} < V_R \\ [n \times \max(m_s, m_d) + (N-n) \times m_d] \times I_{LSB,DLDO} & \text{clamp: } V_R < V_{out} < V_L \\ n \times m_s \times I_{LSB,DLDO} & \text{steady-state: } V_L < V_{out} < V_H \\ 0 & \text{unclamp: } V_{out} > V_H \end{cases}$$ Equation 9

As a comparison with the waveform in FIG. 2, timing diagram 900 demonstrates the waveforms of the nonlinear clamp strength-tuning scheme with the one pattern detector. Here, initially, the D-LDO works with 400 mA load current. Suddenly, an unloading event triggers the unclamp pulse and disables all the D-LDO power gate tiles 107. However, if the new load current, (e.g., 25 mA), is not that light, the output voltage quickly discharges to the low threshold window and generates a clamp pulse.

In various embodiments, pattern detector 401 detects such clamp and unclamp pair, and reduces the dynamic current strength from 255 to 127 to 63 and eventually to 31 (suppose the power gates 107 are arranged in aforementioned binary weighted form), and eliminates the oscillation and minimizes the output ripple noise. Note that the tuning is unilateral, and the clamp strength can be increased when another loading event comes. In one such case, the additional comparing level of $V_R$ is added, generating an under voltage pulse to reset the shift register to the maximum. The under voltage dynamic strength is safe to save the voltage droop on Vout from a future load event, as the 200 mA case. However, the under voltage dynamic strength may be still too large for $I_L$, and one more dynamic strength tuning cycle is executed to reduce $m_d$ from 255 down to 127, and to eliminate the oscillation between clamp and unclamp, and also to minimize the output ripple noise.

Figure 10:
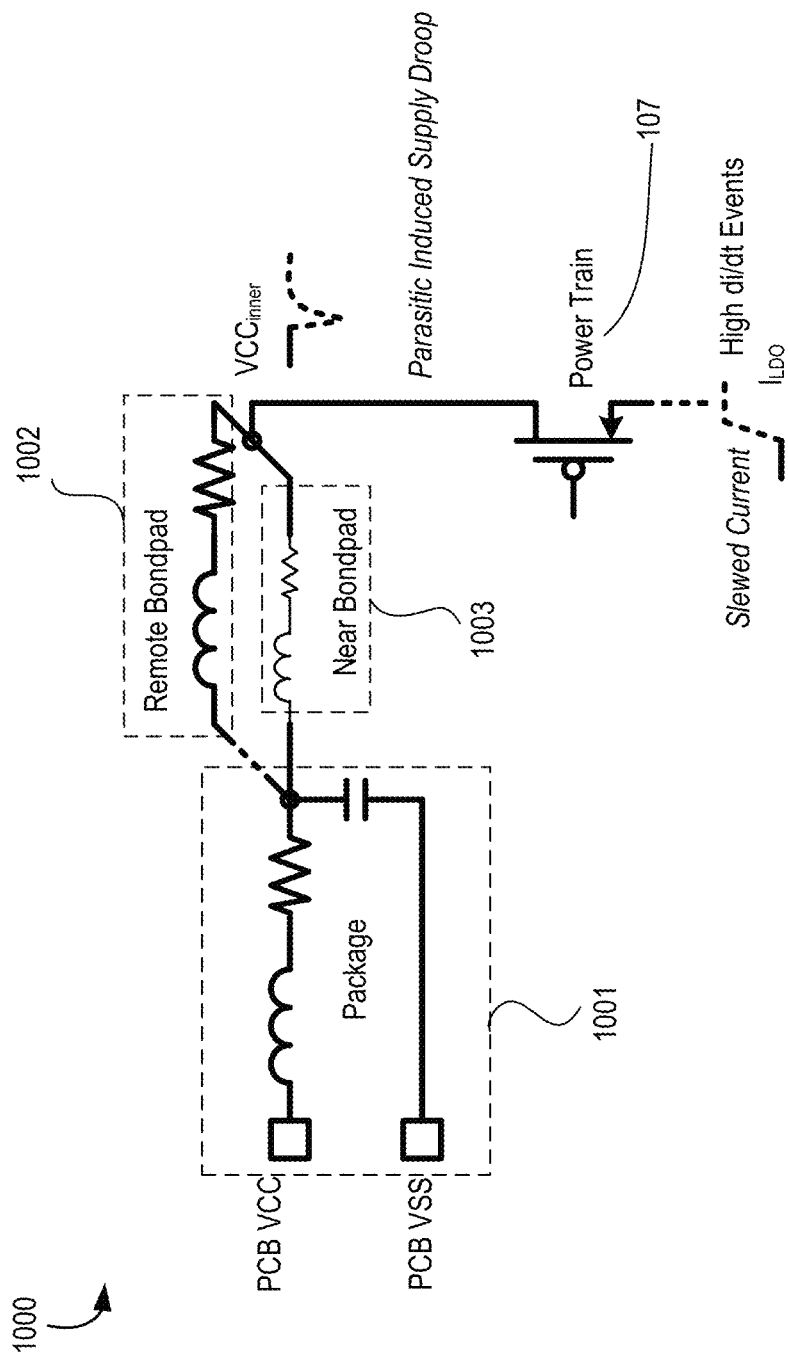
FIG. 10 illustrates a parasitic model of power supply provided as input to the D-LDO.

FIG. 10 illustrates parasitic model 1000 of power supply provided as input to the D-LDO. Model 1000 comprises package parasitic 1001 for supplies PCB (printed circuit board) Vcc and Vss, remote bond pad 1002, and near bond pad 1003 before supply is coupled to power train 107.

The package parasitic inductance and on-chip routing parasitic inductance are the two main bottlenecks for the high di/dt events, such as 1 A/ns as shown in model 1000. The risk of inductance-induced oscillation is discussed as following. First, when there is an under voltage pulse, lots of supply current from the $VCC_{inner}$ rail is pulled by the power PMOS array 107. If the aforementioned parasitic inductance $L_{par}$ are too large due to few package pads and on-chip routing resources, and choke the high speed inrush current and causes a supply droop $\Delta VCC_{inner}$, the effective clamp strength cannot achieve the theoretical value in Equation 9 instantaneously until the delay time $$dt_{undervoltage} \propto \frac{L_{par}}{\Delta VCC_{inner1}} di_{undervoltage}.$$

The digital control loop, at the beginning, may erroneously sense the dynamic clamp strength is not enough, and always seeking overkill value. Second, on the other hand, the unclamp pulse puts the output current to 0.

In the following steady-state, the strength $m_s$ has to slew from 0 and takes time $$dt_{steady\text{-}state} \propto \frac{L_{par}}{\Delta VCC_{inner2}} di_{steady\text{-}state}$$

to settle at the programmed value in Equation 9. In practical applications, the above-mentioned inductance-induced time-constant $dt_{undervoltage}$ and $dt_{steady\text{-}state}$ may be larger than the time that D-LDO's regulation pass through the $V_L$-$V_H$ range. As a result, oscillation may happen between under voltage and unclamp pulses The parasitic inductances make D-LDO controller 104 keep bouncing between the maximum $V_H$ and minimum $V_L$ strength once the output supply rail is triggered by high di/dt load events. In some embodiments, a second pattern detector is used to capture the staggered appearance between under voltage and unclamp, which has the similar mechanism as the first pattern detector 401.

Figure 11:
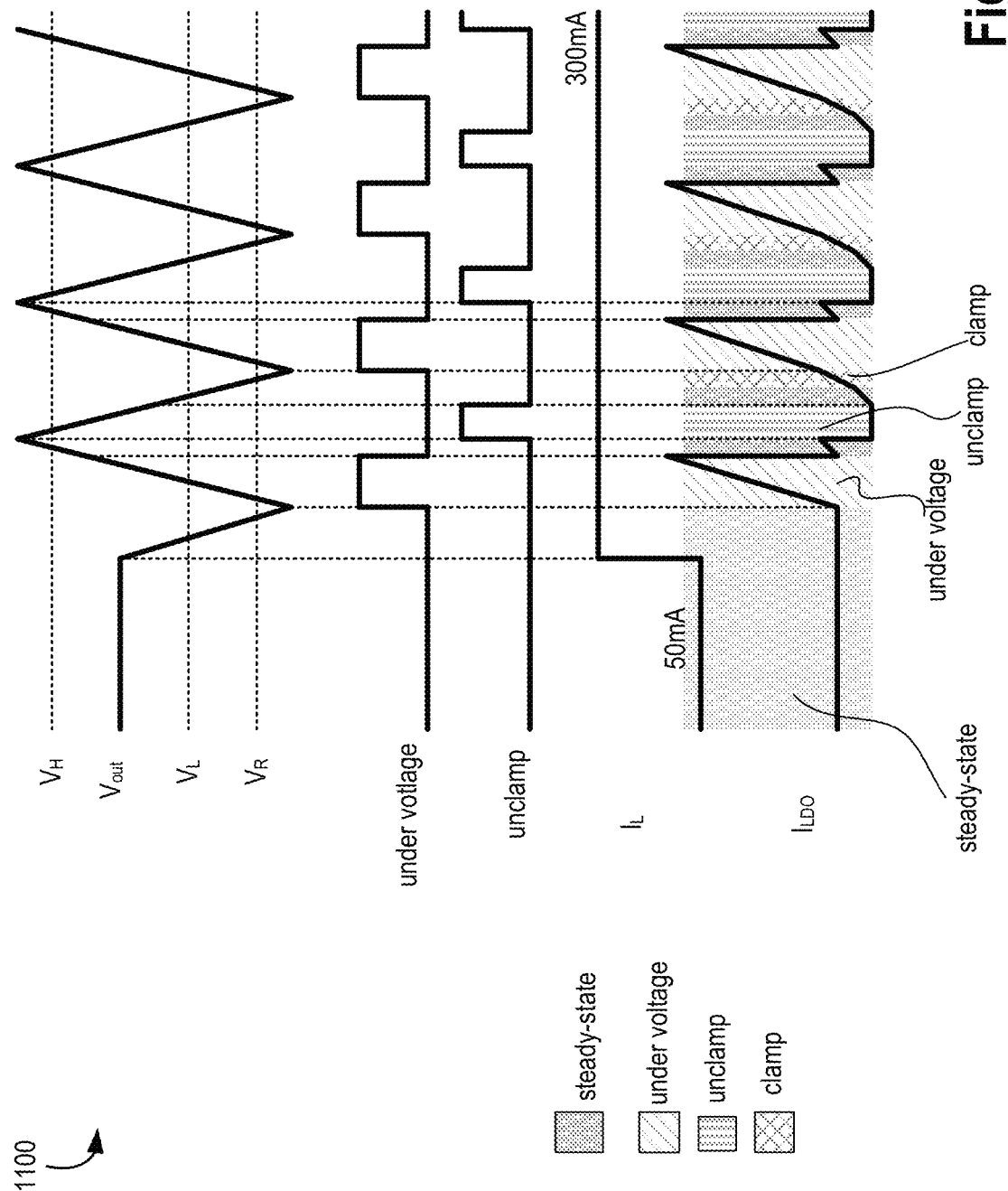
FIG. 11 illustrates a timing diagram showing self-oscillation pattern of slewed D-LDO current by parasitic inductances, in accordance with some embodiments.

FIG. 11 illustrates timing diagram 1100 showing self-oscillation pattern of slewed D-LDO current by parasitic inductances, in accordance with some embodiments. Timing diagram 1100 shows staggered appearance of $V_{out}$ between under voltage and unclamp when load current IL suddenly steps up from 50 mA to 300 mA. Because the high di/dt (e.g., 300 mA) load is faster for the response time of the D-LDO regulation loop and slew of parasitic inductance Lpar, an immediate droop will cross $V_R$ and trigger an under voltage pulse. If the maximum strength (dynamic range) of the power gates is designed much larger than, for example, 300 mA, there will be a drastic overshoot and immediately cross $V_H$ and trigger unclamp pulse to shut down all power gates. Again, if the response time of the regulation loop and slew of Lpar too slow, such unclamp pulse will quickly discharge Vout and fall across $V_R$ again, causing a continuous bouncing between $V_H$ and $V_R$.

Figure 12:
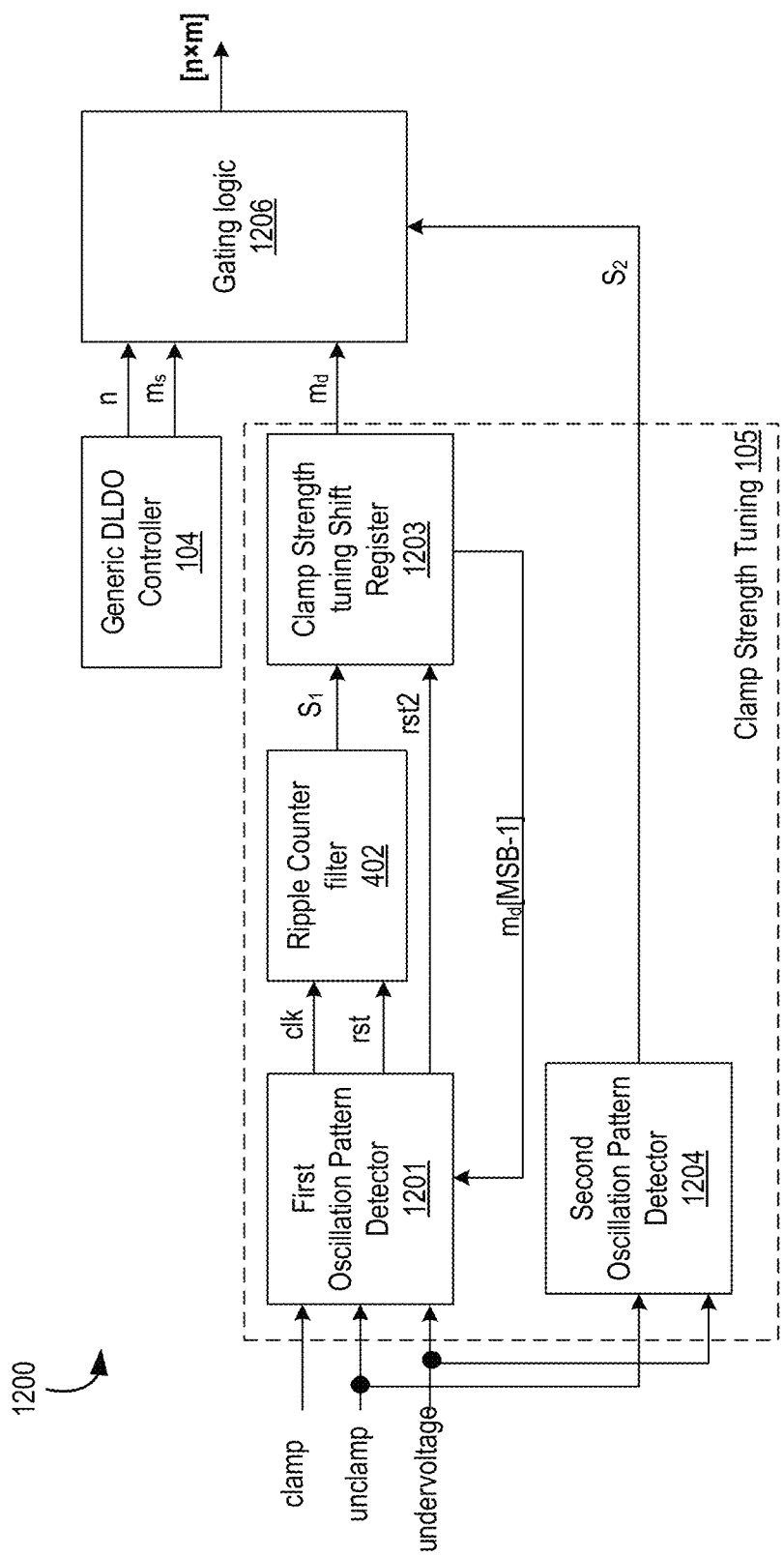
FIG. 12 illustrates an apparatus of non-linear clamp strength tuning scheme instantiated with 3-level ripple quantization and with an additional oscillation pattern detector, in accordance with some embodiments.

FIG. 12 illustrates apparatus 1200 of non-linear clamp strength tuning scheme instantiated with 3-level ripple quantization and with an additional oscillation pattern detector, in accordance with some embodiments. In some embodiments, clamp strength tuning block 105 comprises first oscillation pattern detector 1201 (like 401), ripple counter filter 402, clamp strength tuning shift register 1203 (like 403), and second oscillation pattern detector 1204. The output of clamp strength tuning block 105 is received by gating logic 1206 (like 106).

Besides the detector embodiment, the load current quantization is changed by the background current mechanism and the under voltage skip mechanism. The background current concept is that if the under voltage unclamp oscillation event is captured by second pattern detector 1204, an alert signal $S_2$ is sent to gating logic 1206 to gate the next unclamp operation and pins the strength of power gates 107 as a constant value $n_{bk}$ instead of fully turn-off. Such a background current, $I_{LDO,background}$ lasts when $S_2$ is valid, and helps $I_{LDO,stead\text{-}state}$ ramp up fast in the following steady state period. Once the parasitic inductance-induced oscillation is over, the $I_{LDO}$ current is redefined back to 0 to save overshoot events.

$$I_{LDO} = \begin{cases} N \times M \times I_{LSB,DLDO} & \text{undervoltage: } V_{out} < V_R \\ [n \times \max(m_s, m_d) + \\ (N-n) \times m_d] \times \\ I_{LSB,DLDO} & \text{clamp: } V_R < V_{out} < V_L \\ n \times m_s \times I_{LSB,DLDO} & \text{steady-state: } V_L < V_{out} < V_H \\ n_{bk} \times m_s \times I_{LSB,DLDO} & \text{background: } V_{out} > V_H \text{ and} \\ & S_2 = 0 \\ 0 & \text{unclamp: } V_{out} > V_H \text{ and } S_2 = 1 \end{cases} \quad \text{Equation 10}$$

Figure 13:
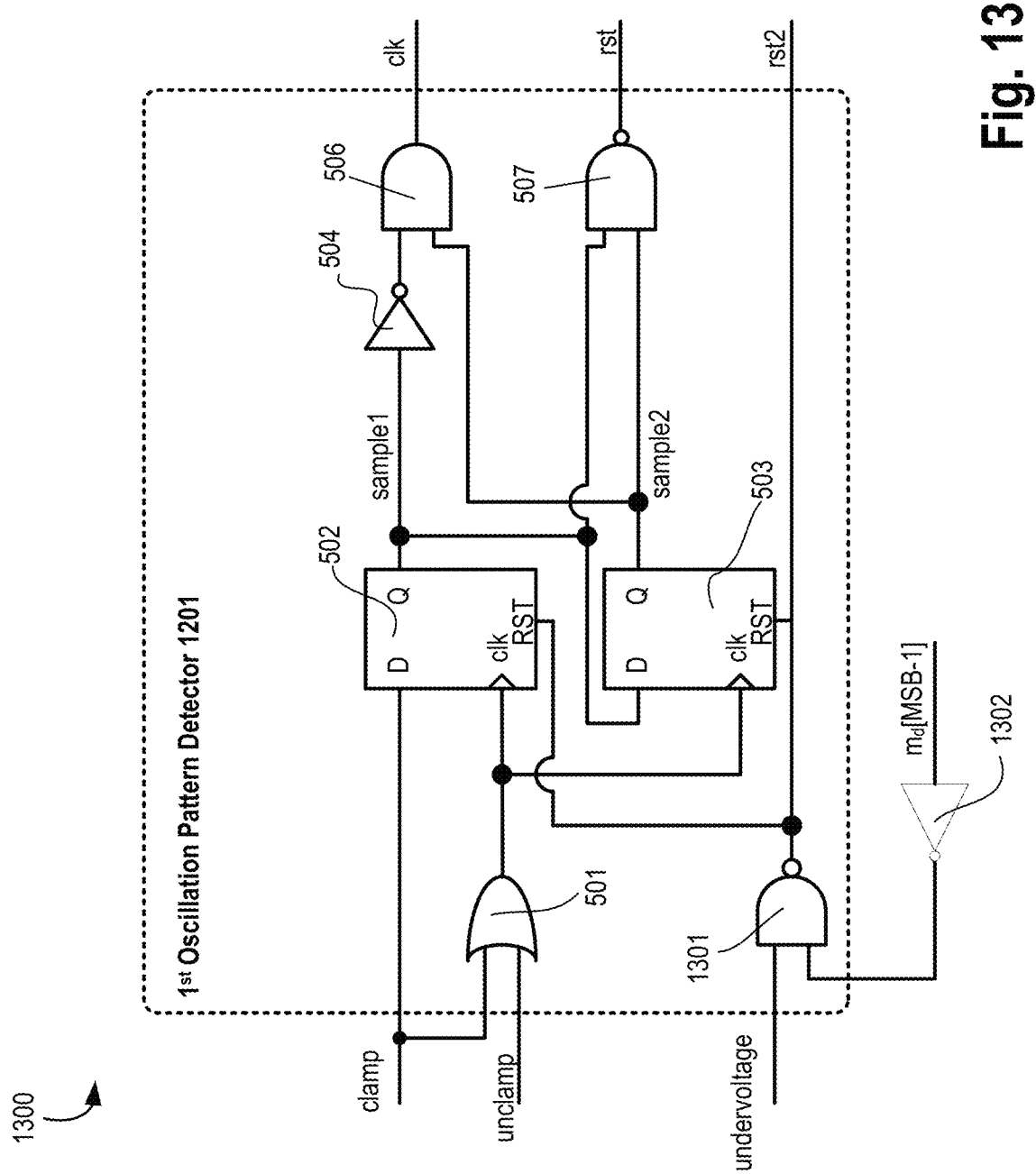
FIG. 13 illustrates a schematic of a first oscillation pattern detector of FIG. 12, in accordance with some embodiments.

FIG. 13 illustrates schematic 1300 of first oscillation pattern detector 1201 of FIG. 12, in accordance with some embodiments. Schematic 1300 is similar to schematic 500 but with the addition of NAND gate 1301 that receives under voltage and an inverted $m_d$[MSB−1] via inverter 1302. This NAND gate 1301 instantiate the under voltage skip mechanism shown in FIG. 16. NAND gate 1301 determines whether the under voltage signal could reset $m_d$ to the maximum value as M as Equation 10. If $m_d$ is already a very large number such as $m_d$[MSB−1]=1 indicating binary weighted $m_d > 2^{MSB-1-1}$, there is no need to reset $m_d$ up to M even when under voltage signal shows up (or is asserted). So the under voltage is skipped and the VR circuit operates as normal clamp period as Equation 11. When $m_d$ is a small number such as $m_d$[MSB−1]=0, NAND gate 1301 allows the under voltage to reset $m_d$ to M. Note that the MSB−1 is an example, and it can also be MSB or MSB−2 to indicate a large value.

Figure 14:
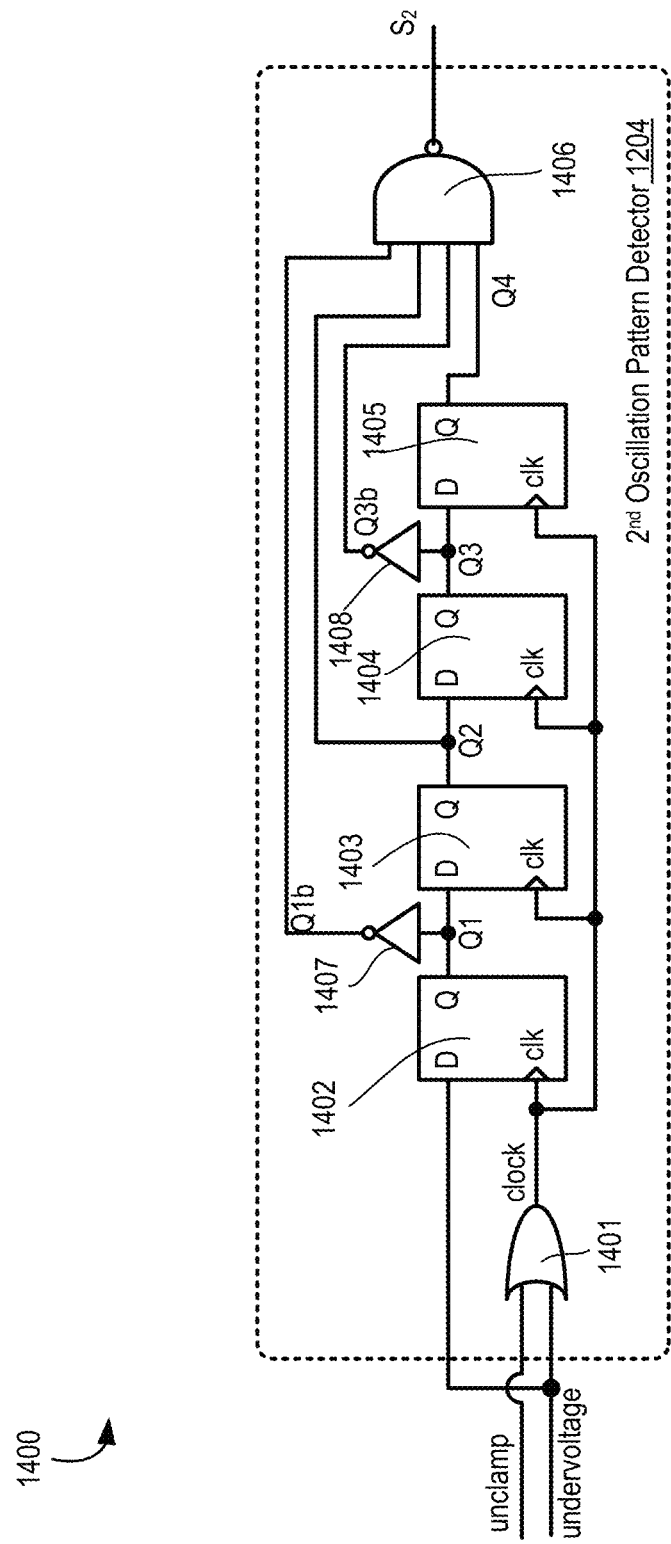
FIG. 14 illustrates a schematic of a second oscillation pattern detector of FIG. 12, in accordance with some embodiments.

FIG. 14 illustrates schematic 1400 of a second oscillation pattern detector 1204 of FIG. 12, in accordance with some embodiments. Second oscillation pattern detector 1204 comprises OR gate 1401 followed by a chain of shift registers 1402, 1403, 1404, and 1405, and NAND gate 1406. The outputs of each FF 1402, 1403, 1404, and 1405 is received by NAND gate 14-6 to generate $S_2$. For example, output Q1 is inverted by inverter 1407, and the output Q1b of inverter 1407 is provided to NAND gate 1406; output Q2 is provided to NAND gate 1406, output Q3 is inverted by inverter 1408, and the output Q3b of inverter 1407 is provided to NAND gate 1406; and output Q4 is provided to NAND gate 1406.

In various embodiments, if the under voltage unclamp oscillation event is captured by second pattern detector 1204, an alert signal $S_2$ is sent to gating logic 1206 to gate the next unclamp operation and pins the turn-on units of power gates 107 as a constant value $n_{bk}$ instead of fully turn-off. In this case, each power gate unit has a strength of $m_s$. Such a background current, $I_{LDO,background}$ lasts when $S_2$ is valid, and helps $I_{LDO,stead-state}$ ramp up fast in the following steady state period.

Figure 15:
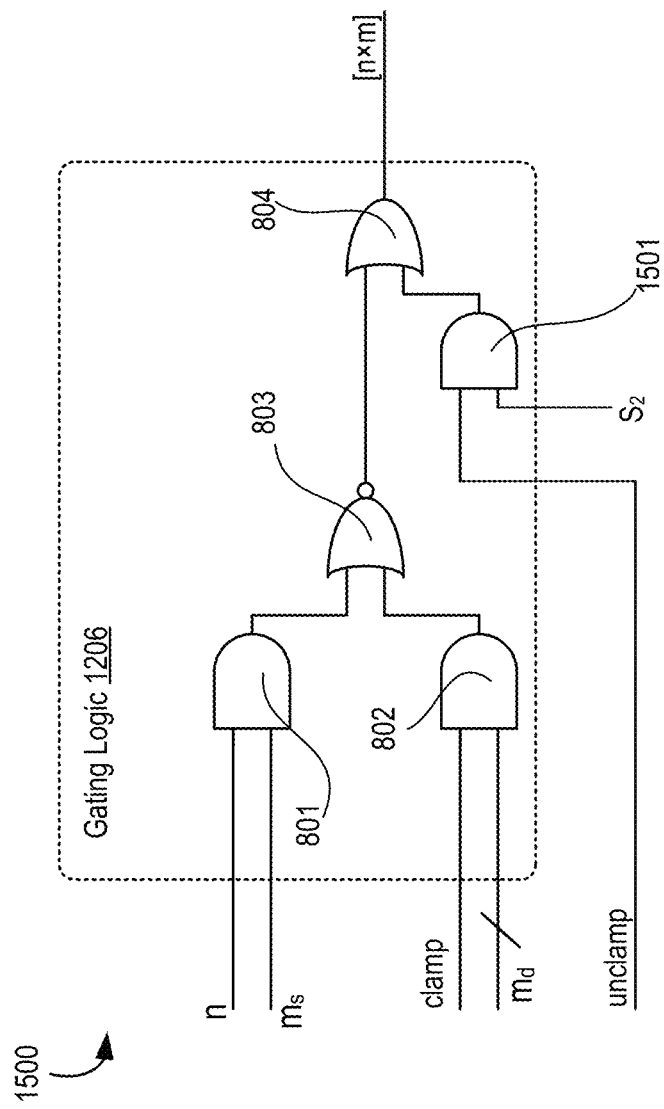
FIG. 15 illustrates a schematic of a gating logic of FIG. 12, in accordance with some embodiments.

FIG. 15 illustrates a schematic 1500 of a gating logic 1206 of FIG. 12, in accordance with some embodiments. Gating logic 1206 is similar to gating logic 106 (or 800) but for the addition of AND gate 1501 which received signals unclamp and $S_2$. Gating logic 1206 receives $S_2$ to gate the next unclamp operation and pins the turn-on unit of power PMOS 107 as a constant value $n_{bk}$ instead of fully turn-off.

Figure 16:
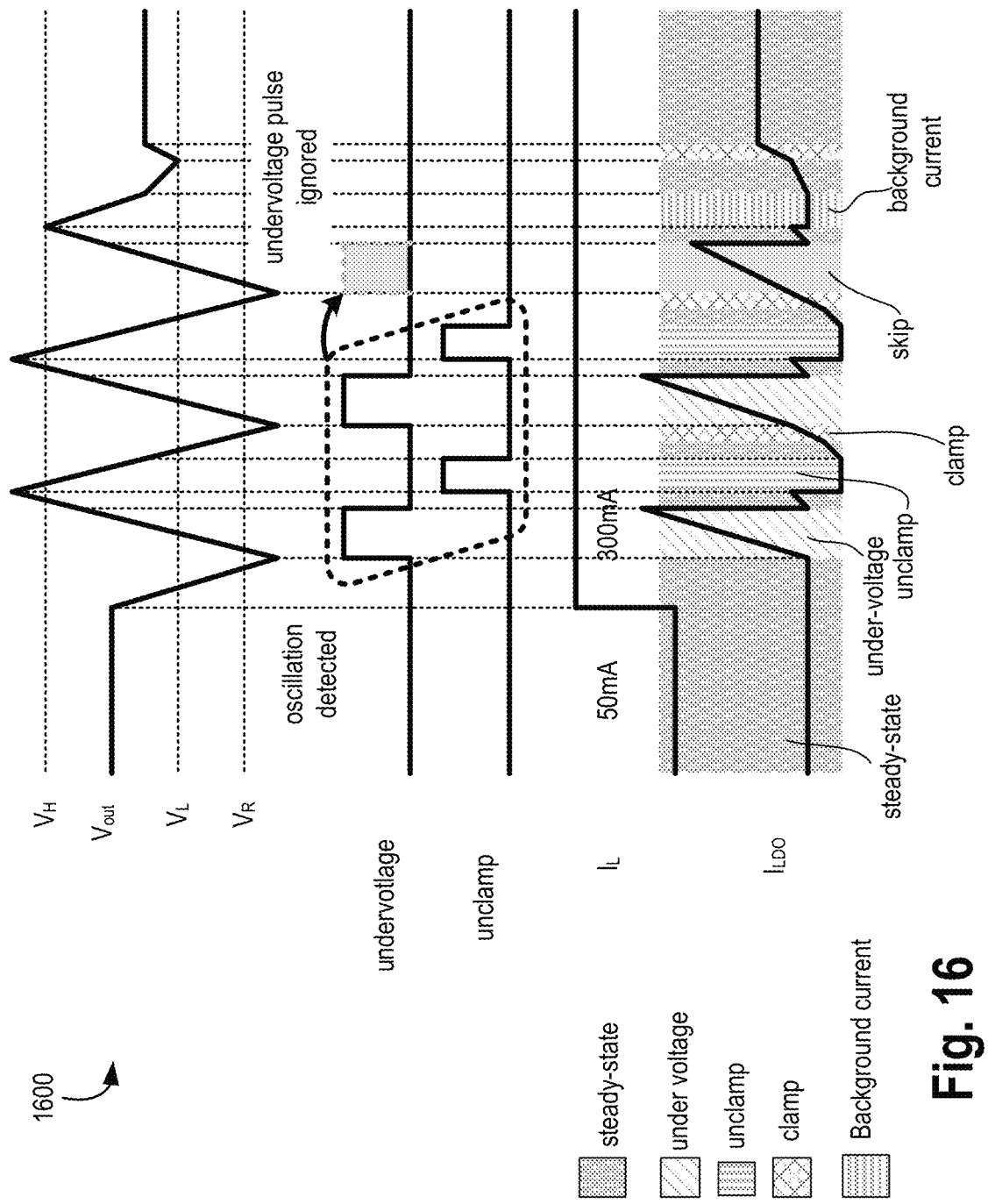
FIG. 16 illustrates a timing diagram of FIG. 12 showing a mechanism to eliminate parasitic inductance induced oscillation, in accordance with some embodiments.

FIG. 16 illustrates timing diagram 1600 of FIG. 12 showing a mechanism to eliminate parasitic inductance induced oscillation, in accordance with some embodiments. Timing diagram 1600 shows the behavior of the $2^{nd}$ pattern detector. Once two pairs of "under voltage" and "unclamp" pulses are captured, the background current is asserted to speed up the slew current through the parasitic inductance.

The under voltage-skip mechanism is that the current $m_d$ strength gates the next under voltage operation. If the oscillation happens and $m_d$ is already very large by detecting the MSB, MSB−1 or other bits of $m_d$ value, $m_d$ does not need to reset to maximum and is ignored, so as to dampen the bouncing between under voltage and unclamp pulses. The power gates 107 are kept the same as previous clamp strength.

$$I_{LDO} = \begin{cases} N \times M \times I_{LSB,DLDO} & \text{undervoltage: } V_{out} < V_R \text{ and } S_2 = 1 \\ [n \times \max(m_s, m_d) + \\ (N-n) \times m_d] \times & \text{skip: } V_{out} < V_R \text{ and } S_2 = 0 \\ I_{LSB,DLDO} \\ [n \times \max(m_s, m_d) + \\ (N-n) \times m_d] \times & \text{clamp: } V_R < V_{out} < V_L \\ I_{LSB,DLDO} \\ n \times m_s \times I_{LSB,DLDO} & \text{steady-state: } V_L < V_{out} < V_H \\ n_{bk} \times m_s \times I_{LSB,DLDO} & \text{background: } V_{out} > V_H \text{ and} \\ & S_2 = 0 \\ 0 & \text{unclamp: } V_{out} > V_H \text{ and } S_2 = 1 \end{cases}$$

Equation 11

The parasitic inductance-induced oscillation is solved in two folds. First, the overshoot ripple during the unclamp period is aided by the non-zero $I_{LDO,background}$. Second, the droop ripple during the under voltage period skips the under voltage operation (treated as normal clamp operation) and gives more time for the clamp strength tuning algorithm to settle down in proper values.

Figure 17:
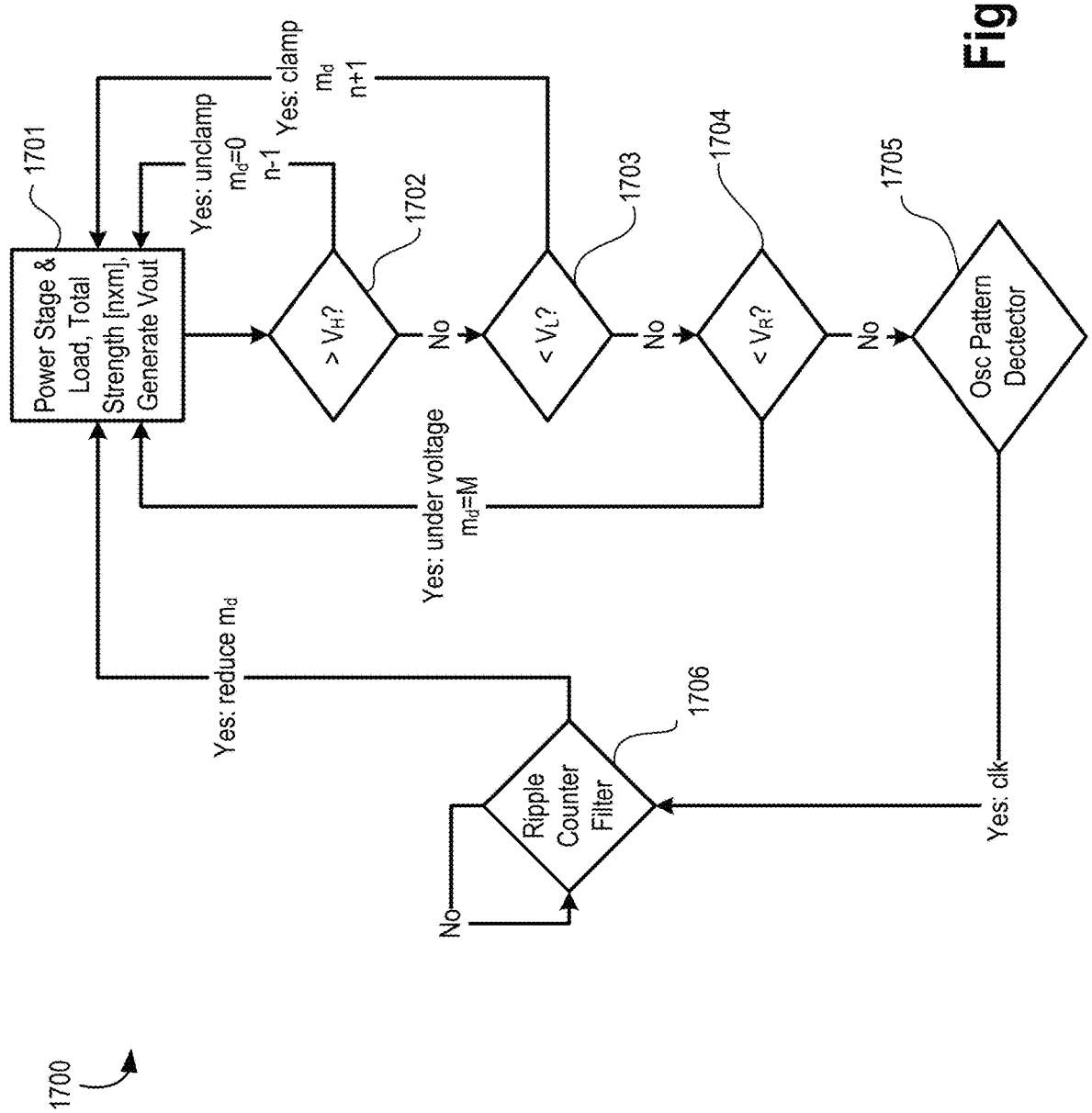
FIG. 17 illustrates a flowchart of a method of regulating in accordance with the apparatus of FIG. 4, in accordance with some embodiments.

FIG. 17 illustrates flowchart 1700 of a method of regulating in accordance with the apparatus of FIG. 4, in accordance with some embodiments.

Flowchart 1700 explains the operation mechanism of FIG. 1 and FIG. 4. At block 1701, the power stage is assumed with [n×m] array and generates the output voltage Vout. At block 1702, a determination is made about whether Vout is greater than $V_H$. If Vout is greater than $V_H$, which means Vout overshoot, the unclamp signal enforces $m_d=0$ and reduces unit n, e.g., to n−1, linearly.

If Vout is not greater than $V_H$, the process proceeds to block 1703. At block 1703, a determination is made about whether Vout is less than $V_L$. If Vout is less than $V_L$, which means Vout undershoot, the clamp signal sets the strength to $m_d$ and increase unit n, e.g., to n+1, linearly.

If Vout is not greater than $V_L$, the process proceeds to block 1704. At block 1704, a determination is made about whether Vout is less than $V_R$. If Vout is less than $V_R$, which means significant droop, the strength is immediately maximized as $m_d$=M.

If Vout is not greater than $V_L$ then the process proceeds to block 1705. At block 1705, an oscillation pattern detector monitors the possible oscillation between clamp and unclamp signals. Once the oscillation accumulates to a certain count, as indicated by block 1706, the dynamic strength $m_d$ is reduced, e.g., shift right as divide-by-2 non-linearly.

Figure 18:
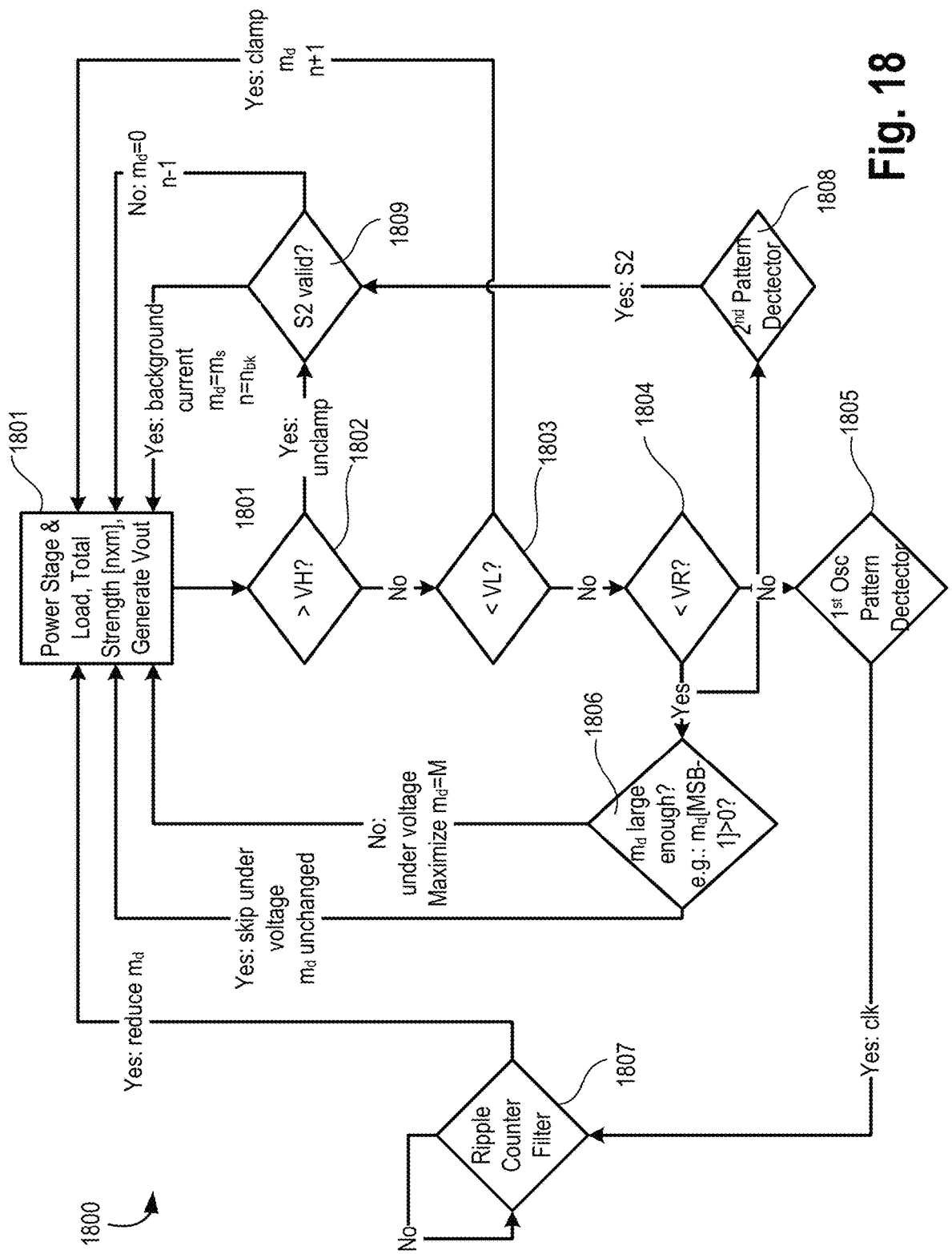
FIG. 18 illustrates a flowchart of a method of regulating in accordance with the apparatus of FIG. 12, in accordance with some embodiments.

FIG. 18 illustrates flowchart 1800 of a method of regulating in accordance with the apparatus of FIG. 12, in accordance with some embodiments. Flowchart 1800 illustrates a complete mechanism of FIG. 12.

At block 1801, the power stage is assumed with [n×m] array and generates the output voltage Vout. At block 1802, a determination is made about whether Vout is greater than $V_H$. If Vout is greater than $V_H$, which means Vout overshoot, the process proceeds to block 1809. At block 1809, a determination is made regarding the validity of the second oscillation detector result $S_2$. Based on the second oscillation detector result $S_2$, if there is no oscillation, the unclamp operation is normal in which power gates are shut down, $m_d$=0 and n is reduced (e.g., by n−1). Otherwise, there is a background current, which defines certain $n_{bk}$ and $m_s$ strengths, and the process proceeds to block 1801.

If Vout is not greater than $V_H$, the process proceeds to block 1803. At block 1803, a determination is made about whether Vout is less than $V_L$. If Vout is less than $V_L$, which means Vout undershoot, the clamp signal sets the strength to $m_d$ and increases unit n, e.g. to n+1 linearly.

If Vout is not greater than $V_L$, the process proceeds to block 1804. At block 1804, a determination is made about whether Vout is less than $V_R$. If Vout is less than $V_R$, which means significant droop, the strength is immediately maximized as $m_d$=M.

If Vout is not greater than $V_L$ then the process proceeds to block 1805. If Vout is less than $V_R$, it means significant droop, and the process proceeds to block 1806. At block 1806, it is determined whether the strength of ma is large enough (e.g., the MSB−1 of ma is greater than 0). If the strength of ma is not large enough, then the strength ma is maximized to M, and the process proceeds to block 1801. If the strength of $m_d$ is large enough, $m_d$ remains unchanged and under voltage analysis is skipped and the process proceeds to block 1801.

If Vout is not greater than $V_R$ then the process proceeds to block 1805. At block 1805, the first oscillation pattern detector monitors the possible oscillation between clamp and unclamp signals. Once the oscillation accumulates to certain counter number (as indicated by ripple counter output in block 1807), the dynamic strength of ma is reduced. Simultaneously, at block 1808, the second oscillation detector monitors the possible oscillation between unclamp and under voltage signals, and then proceeds to block 1809.

Figure 19:
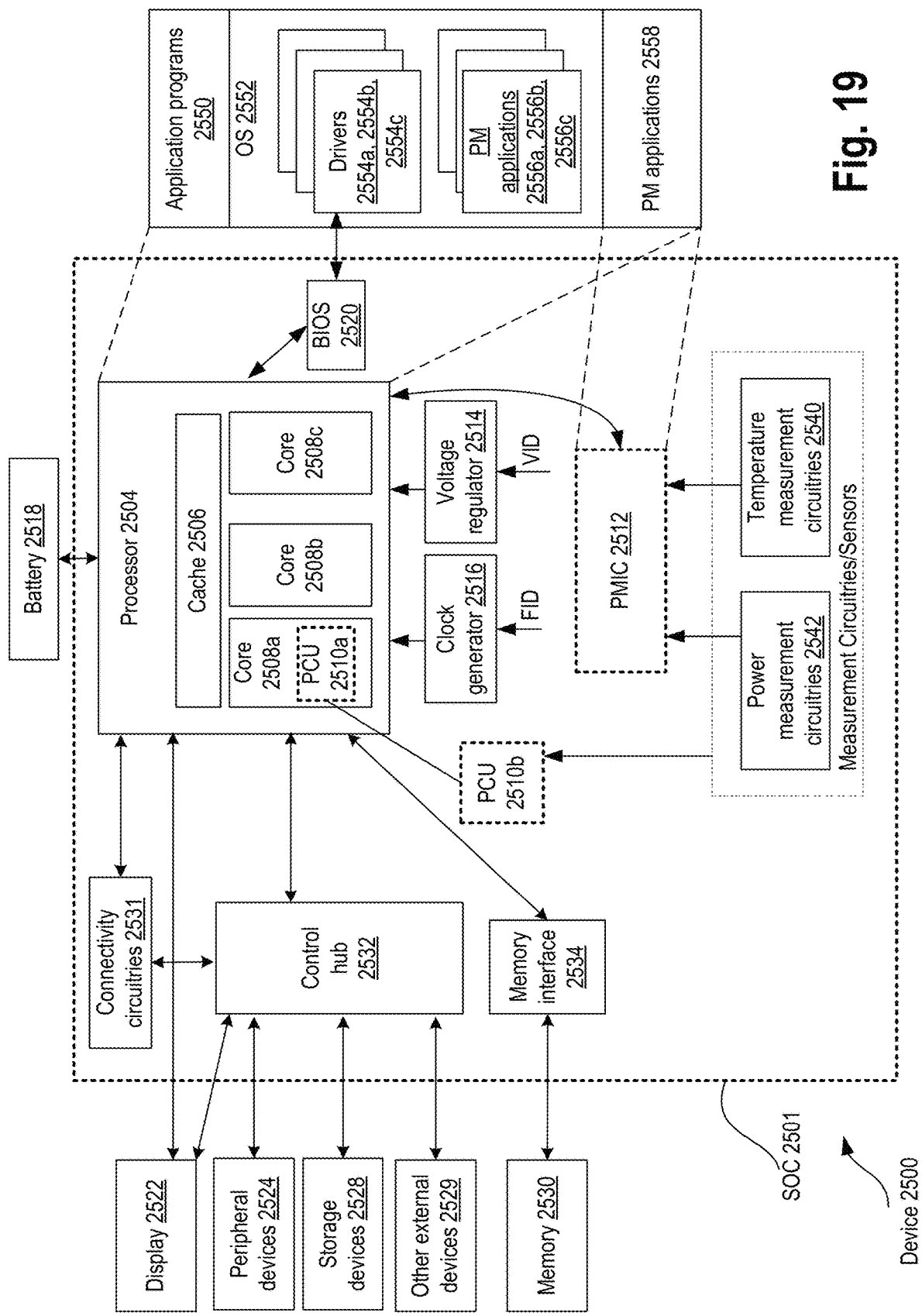
FIG. 19 illustrates a smart device, or a computer system, or a SoC (System-on-Chip) with 3-level ripple quantization and non-linear clamp strength tuning scheme, according to some embodiments of the disclosure.

FIG. 19 illustrates a smart device, or a computer system, or a SoC (System-on-Chip) with 3-level ripple quantization and non-linear clamp strength tuning scheme, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here that provide power to one or more logic devices can have the non-linear clamp strength tuning scheme of various embodiments.

In an example, the device 2500 comprises a SoC (System-on-Chip) 2501. An example boundary of the SOC 2501 is illustrated using dotted lines in FIG. 19, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508*a*, 2508*b*, 2508*c*. Although merely three cores 2508*a*, 2508*b*, 2508*c* are illustrated, processor 2504 may include any other appropriate number of processing cores, e.g., tens, or even hundreds of processing cores. Processor cores 2508*a*, 2508*b*, 2508*c* may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508*a*, a second section of cache 2506 dedicated to core 2508*b*, and so on). In an example, one or more sections of cache 2506 may be shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions may be fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508*a*, 2508*b*, 2508*c*, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510*a/b* and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments. In some embodiments, the VR applies a 3-level ripple quantization and non-linear clamp strength tuning scheme.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510*a*. In an example, some other sections of PCU 2510 may be implemented outside the processing cores 2508, and these sections of PCU 2510 are symbolically illustrated using a dotted box and labelled as PCU 2510*b*. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor (s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556a, 2556b, 2556c. The OS 2552 may also include various drivers 2554a, 2554b, 2554c, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a first comparator to compare an output voltage or a divided version of the output voltage on an output power supply rail with a first reference, wherein the first comparator is to generate a first output; a second comparator to compare the output voltage or a divided version of the output voltage on the output power supply rail with a second reference, wherein the second comparator is to generate a second output; a third comparator to compare the output voltage or a divided version of the output voltage on the output power supply rail with a third reference, wherein the third comparator is to generate a third output; power gates coupled to the output power supply rail; a first controller to receive the first and second outputs and to generate a code indicative of a coarse setting for power gates; and a second controller to receive the first, second, and third outputs, wherein the second controller is to generate a fine code for the power gates.

Example 2: The apparatus of example 1 comprises a gating logic to receive the coarse and fine codes, and to generate a two dimensional code to enable power gates, wherein the power gates are arranged in an array configuration.

Example 3: The apparatus of example 1, wherein the array configuration is a thermometer array.

Example 4: The apparatus of example 1, wherein the array configuration is a binary array.

Example 5: The apparatus of example 1, wherein the first reference has a voltage level below a voltage level of the second reference, and wherein the third reference has a voltage level below the voltage level of the first reference.

Example 6: The apparatus of example 1, wherein the first output when asserted indicates that the output voltage is below the first reference, wherein the second output when asserted indicates that the output voltage is above the second threshold, and wherein the third output when asserted indicates that the output voltage is below the third reference.

Example 7: The apparatus of example 1, wherein the second controller provides non-linear strength tuning of the power gates, wherein the first controller provides linear strength tuning of the power gates.

Example 8: The apparatus of example 1, wherein the second controller comprises a pattern detector, which generates a pulse when the first and second outputs appear in a staggered order indicative of an oscillation of the output voltage.

Example 9: The apparatus of example 8, wherein the second controller comprises a filter coupled to an output of the pattern detector to filter the pulse from noise.

Example 10: The apparatus of example 9, wherein the second controller comprises a shift register coupled to the output of the filter, wherein the shift register generates the fine code dynamically.

Example 11: An apparatus comprising: a first comparator to compare an output voltage or a divided version of the output voltage on an output power supply rail with a first reference, wherein the first comparator is to generate a first output; a second comparator to compare the output voltage or a divided version of the output voltage on the output power supply rail with a third reference, wherein the second comparator is to generate a second output; a third comparator to compare the output voltage or a divided version of the output voltage on the output power supply rail with a third reference, wherein the third comparator is to generate a third output; power gates coupled to the output power supply rail; a first controller to receive the first and second outputs and to generate a first code for linear strength tuning of the power gates; and a second controller to receive the first, second, and third outputs, wherein the second controller is to generate a second code for non-linear strength tuning of the power gates.

Example 12: The apparatus of example 11, wherein the second controller comprises a pattern detector, which generates a pulse when the first and second outputs appear in a staggered order indicative of an oscillation of the output voltage.

Example 13: The apparatus of example 12, wherein the second controller comprises a filter coupled to an output of the pattern detector to filter the pulse from noise.

Example 14: The apparatus of example 13, wherein the second controller comprises a shift register coupled to the output of the filter, wherein the shift register generates the non-linear code dynamically.

Example 15: A system comprising: a memory; a processor core coupled to the memory; a digital low dropout (D-LDO) regulator to receive an input power supply voltage and to generate an output power supply voltage on an output power supply rail for the processor core, wherein the D-DLO comprises: a 3-level ripple quantization circuitry to generate first, second, and third outputs in accordance with first, second, and third reference voltages, respectively; power gates coupled to the output power supply rail; a first controller to receive the first and second outputs and to generate a first code for linear strength tuning of the power gates; and a second controller to receive the first, second, and third outputs, wherein the second controller is to generate a second code for non-linear strength tuning of the power gates; and a wireless interface to allow the processor to communicate with another device.

Example 16: The system of example 15, wherein the second controller comprises a pattern detector which generates a pulse when the first and second outputs appear in a staggered order indicative of an oscillation of the output voltage.

Example 17: The system of example 16, wherein the second controller comprises a filter coupled to an output of the pattern detector to filter the pulse from noise.

Example 18: The system of example 17, wherein the second controller comprises a shift register coupled to the output of the filter, wherein the shift register generates the non-linear code dynamically.

Example 19: The system of example 15, wherein the D-LDO comprises a gating logic to receive the linear and non-linear codes, and to generate a two dimensional code to enable power gates, wherein the power gates are arranged in an array configuration.

Example 20: The system of example 9, wherein the array configuration is one of a thermometer array or a binary array.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first comparator to compare an output voltage or a divided version of the output voltage on an output power supply rail with a first reference, wherein the first comparator is to generate a first output;
   a second comparator to compare the output voltage or a divided version of the output voltage on the output power supply rail with a second reference, wherein the second comparator is to generate a second output;
   a third comparator to compare the output voltage or a divided version of the output voltage on the output power supply rail with a third reference, wherein the third comparator is to generate a third output;
   power gates coupled to the output power supply rail;
   a first controller to receive the first and second outputs and to generate a code indicative of a coarse setting for power gates; and
   a second controller to receive the first, second, and third outputs, wherein the second controller is to generate a fine code for the power gates;
   wherein the first reference has a voltage level below a voltage level of the second reference, and wherein the third reference has a voltage level below the voltage level of the first reference.

2. The apparatus of claim 1, further comprising a gating logic to receive the coarse and fine codes, and to generate a two dimensional code to enable power gates, wherein the power gates are arranged in an array configuration.

3. The apparatus of claim 2, wherein the array configuration is a thermometer array.

4. The apparatus of claim 2, wherein the array configuration is a binary array.

5. The apparatus of claim 1, wherein the first output when asserted indicates that the output voltage is below the first reference, wherein the second output when asserted indicates that the output voltage is above the second threshold, and wherein the third output when asserted indicates that the output voltage is below the third reference.

6. The apparatus of claim 1, wherein the second controller provides non-linear strength tuning of the power gates, wherein the first controller provides linear strength tuning of the power gates.

7. The apparatus of claim 1, wherein the second controller comprises a pattern detector, which generates a pulse when the first and second outputs appear in a staggered order indicative of an oscillation of the output voltage.

8. The apparatus of claim 7, wherein the second controller further comprises a filter coupled to an output of the pattern detector to filter the pulse from noise.

9. The apparatus of claim 8, wherein the second controller further comprises a shift register coupled to the output of the filter, wherein the shift register generates the fine code dynamically.

10. An apparatus comprising:
a first comparator to compare an output voltage or a divided version of the output voltage on an output power supply rail with a first reference, wherein the first comparator is to generate a first output;
a second comparator to compare the output voltage or a divided version of the output voltage on the output power supply rail with a second reference, wherein the second comparator is to generate a second output;
a third comparator to compare the output voltage or a divided version of the output voltage on the output power supply rail with a third reference, wherein the third comparator is to generate a third output;
power gates coupled to the output power supply rail;
a first controller to receive the first and second outputs and to generate a first code for linear strength tuning of the power gates; and
a second controller to receive the first, second, and third outputs, wherein the second controller is to generate a second code for non-linear strength tuning of the power gates, and wherein the second controller comprises a pattern detector that generates a pulse when the first and second outputs appear in a staggered order indicative of an oscillation of the output voltage.

11. The apparatus of claim 10, wherein the second controller further comprises a filter coupled to an output of the pattern detector to filter the pulse from noise.

12. The apparatus of claim 11, wherein the second controller further comprises a shift register coupled to the output of the filter, wherein the shift register generates the non-linear code dynamically.

13. A system comprising:
a memory;
a processor core coupled to the memory;
a digital low dropout (D-LDO) regulator to receive an input power supply voltage and to generate an output power supply voltage on an output power supply rail for the processor core, wherein the D-LDO comprises:
a 3-level ripple quantization circuitry to generate first, second, and third outputs in accordance with first, second, and third reference voltages, respectively;
power gates coupled to the output power supply rail;
a first controller to receive the first and second outputs and to generate a first code for linear strength tuning of the power gates; and
a second controller to receive the first, second, and third outputs, wherein the second controller is to generate a second code for non-linear strength tuning of the power gates, and wherein the second controller comprises a pattern detector which generates a pulse when the first and second outputs appear in a staggered order indicative of an oscillation of the output voltage; and
a wireless interface to allow the processor to communicate with another device.

14. The system of claim 13, wherein the second controller further comprises a filter coupled to an output of the pattern detector to filter the pulse from noise.

15. The system of claim 14, wherein the second controller further comprises a shift register coupled to the output of the filter, wherein the shift register generates the non-linear code dynamically.

16. The system of claim 13, wherein the D-LDO comprises a gating logic to receive the linear and non-linear codes, and to generate a two dimensional code to enable power gates, wherein the power gates are arranged in an array configuration.

17. The system of claim 16, wherein the array configuration is one of a thermometer array or a binary array.

18. An apparatus comprising:
a first comparator to compare an output voltage or a divided version of the output voltage on an output power supply rail with a first reference, wherein the first comparator is to generate a first output;
a second comparator to compare the output voltage or a divided version of the output voltage on the output power supply rail with a second reference, wherein the second comparator is to generate a second output;
a third comparator to compare the output voltage or a divided version of the output voltage on the output power supply rail with a third reference, wherein the third comparator is to generate a third output;
power gates coupled to the output power supply rail;
a first controller to receive the first and second outputs and to generate a code indicative of a coarse setting for power gates; and
a second controller to receive the first, second, and third outputs, wherein the second controller is to generate a fine code for the power gates, and wherein the second controller comprises a pattern detector, which generates a pulse when the first and second outputs appear in a staggered order indicative of an oscillation of the output voltage.

19. The apparatus of claim 18, wherein the second controller comprises a filter coupled to an output of the pattern detector to filter the pulse from noise.

20. The apparatus of claim 19, wherein the second controller comprises a shift register coupled to the output of the filter, wherein the shift register generates the fine code dynamically.

21. The apparatus of claim 18, further comprising a gating logic to receive the coarse and fine codes, and to generate a two dimensional code to enable power gates, wherein the power gates are arranged in an array configuration.

22. The apparatus of claim 18, wherein the first output when asserted indicates that the output voltage is below the first reference, wherein the second output when asserted indicates that the output voltage is above the second threshold, and wherein the third output when asserted indicates that the output voltage is below the third reference.

\* \* \* \* \*